United States Patent
Zhang et al.

(10) Patent No.: US 12,433,119 B2
(45) Date of Patent: Sep. 30, 2025

(54) DISPLAY SUBSTRATE AND DISPLAY APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Dacheng Zhang, Beijing (CN); Chen Xu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 271 days.

(21) Appl. No.: 17/605,664

(22) PCT Filed: Jun. 8, 2021

(86) PCT No.: PCT/CN2021/098923
§ 371 (c)(1),
(2) Date: Jul. 7, 2022

(87) PCT Pub. No.: WO2022/142141
PCT Pub. Date: Jul. 7, 2022

(65) Prior Publication Data
US 2023/0363223 A1    Nov. 9, 2023

(30) Foreign Application Priority Data

Jan. 4, 2021   (CN) .......................... 202110000866.2

(51) Int. Cl.
*H10K 59/131* (2023.01)
*H10K 59/121* (2023.01)
(Continued)

(52) U.S. Cl.
CPC ..... *H10K 59/1315* (2023.02); *H10K 59/1213* (2023.02); *H10K 59/1216* (2023.02); *H10K 59/38* (2023.02); *H10K 2102/351* (2023.02)

(58) Field of Classification Search
CPC . H10K 59/1315; H10K 59/1213; H10K 59/38
(Continued)

(56) References Cited

U.S. PATENT DOCUMENTS

| | | |
|---|---|---|
| 11,049,885 B2 | 6/2021 | Zhang |
| 2007/0019143 A1 | 1/2007 | Chen et al. |

(Continued)

FOREIGN PATENT DOCUMENTS

| | | |
|---|---|---|
| CN | 102593095 A | 7/2012 |
| CN | 103700322 A | 4/2014 |

(Continued)

OTHER PUBLICATIONS

Australian Office Action from Application No. 2021221904 dated Jul. 25, 2022.

(Continued)

*Primary Examiner* — Xia L Cross
(74) *Attorney, Agent, or Firm* — Dilworth & Barrese, LLP.; Michael J. Musella, Esq.

(57) ABSTRACT

A display substrate and a display apparatus are provided. The display substrate includes a first conductive structure including a first surface and a third surface that are opposite and a second surface and a fourth surface that are opposite. The first surface and the second surface respectively have different angles with a plate surface of the base substrate. The first surface and the second surface are respectively provided with a first surface microstructure and a second surface microstructure; the first cross section has a first orthogonal projection on the third surface, and a length of the first orthogonal projection is less than a length of the first surface microstructure in the first cross section; the second cross section has a second orthogonal projection on the fourth surface, and a length of the second orthogonal projection is less than a length of the second surface microstructure in the second cross section.

42 Claims, 13 Drawing Sheets

(51) Int. Cl.
*H10K 59/38* (2023.01)
*H10K 102/00* (2023.01)

(58) Field of Classification Search
USPC .......................................... 257/40
See application file for complete search history.

(56) References Cited

U.S. PATENT DOCUMENTS

| | | | | |
|---|---|---|---|---|
| 2016/0035812 | A1* | 2/2016 | Kwon | H10D 86/411 |
| | | | | 438/151 |
| 2017/0317299 | A1* | 11/2017 | Choi | H10K 59/873 |
| 2018/0331166 | A1* | 11/2018 | Cho | H10K 77/111 |
| 2019/0237516 | A1 | 8/2019 | Kim et al. | |
| 2020/0328234 | A1* | 10/2020 | Zhang | H10D 86/0212 |
| 2021/0225955 | A1 | 7/2021 | Yuan et al. | |

FOREIGN PATENT DOCUMENTS

| | | |
|---|---|---|
| CN | 107424520 A | 12/2017 |
| CN | 110956911 A | 4/2020 |
| CN | 112331714 A | 2/2021 |
| EP | 3223324 A1 | 9/2017 |
| JP | 2016095422 A | 5/2016 |

OTHER PUBLICATIONS

European Office Action issued by the European Patent Office in Application No. 21743021.4; the Office Action has an issue date of Sep. 6, 2023.

\* cited by examiner

Display Apparatus
30

Display Panel
20

DISPLAY SUBSTRATE AND DISPLAY APPARATUS

The present application claims priority of Chinese Application No. 202110000866.2, filed on Jan. 4, 2021, and the entire content disclosed by the Chinese application is incorporated herein by reference as part of the present application.

TECHNICAL FIELD

Embodiments of the present disclosure relate to a display substrate and a display device.

BACKGROUND

In a display field, an Organic Light-Emitting Diode (OLED) has characteristics such as self-luminescence, high contrast, low energy consumption, wide viewing angle, fast response speed, applicability to flexible panels, wide range of operation temperature, and simple fabrication, and has broad prospects for development. Semiconductor technology as a core of a display apparatus also makes rapid progress. Organic Light-Emitting Diode (OLED), as a current-type light-emitting device, because of its characteristics such as self-luminescence, fast response speed, wide viewing angle, and fabricability on a flexible substrate, is increasingly applied to a technical field of high-performance display.

SUMMARY

At least an embodiment of the present disclosure provides a display substrate, comprising a base substrate and a first conductive structure on the base substrate. The first conductive structure comprises a first surface and a second surface away from the base substrate, and the first surface and the second surface are made of a same material; the first surface has a first included angle with a plate surface of the base substrate, the second surface has a second included angle with the plate surface of the base substrate, and the first included angle is different from the second included angle; the first surface is provided with a first surface microstructure, and the second surface is provided with a second surface microstructure; the first conductive structure further comprises a third surface and a fourth surface close to the base substrate, the third surface is opposite to the first surface, and the fourth surface is opposite to the second surface; the first surface microstructure has a first cross section perpendicular to the base substrate, the first cross section has a first orthogonal projection on the third surface, and a length of the first orthogonal projection is less than a length of the first surface microstructure in the first cross section; and the second surface microstructure has a second cross section perpendicular to the base substrate, the second cross section has a second orthogonal projection on the fourth surface, and a length of the second orthogonal projection is less than a length of the second surface microstructure in the second cross section.

In some examples, a distance between two ends of the first cross section and a distance between two ends of the second cross section are respectively greater than 0.1 microns and less than 1 micron.

In some examples, in a direction perpendicular to the base substrate, the first surface microstructure at least partially overlaps with the third surface, and the second surface microstructure at least partially overlaps with the fourth surface.

In some examples, at least one of the third surface and the fourth surface is a flat surface.

In some examples, an area of the orthogonal projection of the first surface microstructure on the third surface is less than a surface area of the first surface microstructure; and an area of the orthogonal projection of the second surface microstructure on the fourth surface is less than a surface area of the second surface microstructure.

In some examples, a minimum thickness of the first conductive structure at the first surface microstructure is less than an average thickness of the first conductive structure and greater than ⅗ of the average thickness of the first conductive structure.

In some examples, the first surface microstructure has a first end point, a first intermediate point and a second end point in the first cross section; and the second surface microstructure has a third end point, a second intermediate point, and a fourth end point in the second cross section; a distance between the first intermediate point and the third surface is equal to neither a distance between the first end point and the third surface nor a distance between the second end point and the third surface; a distance between the second intermediate point and the fourth surface is equal to neither a distance between the third end point and the fourth surface, nor a distance between the fourth end point and the fourth surface.

In some examples, the first included angle is greater than 0 degrees; and the second included angle is equal to 0 degrees.

In some examples, the first surface microstructure has a first end point and a second end point in the first cross section; and the second surface microstructure has a third end point and a fourth end point in the second cross section; a distance from a midpoint of a line segment composed of the first end point and the second end point to the plate surface of the base substrate is different from a distance from a midpoint of a line segment composed of the third end point and the fourth end point to the plate surface of the base substrate.

In some examples, a distance between the first end point and the second end point is greater than a distance between the third end point and the fourth end point.

In some examples, the display substrate further comprises a first insulating layer on a side of the first conductive structure close to the base substrate; the first insulating layer comprises a first portion in direct contact with the third surface of the first conductive structure and a second portion in direct contact with the fourth surface of the first conductive structure; and a minimum thickness of the first portion is less than a minimum thickness of the second portion.

In some examples, the display substrate further comprises a second conductive structure on a side of the first insulating layer close to the base substrate; the first portion of the first insulating layer covers at least a portion of the second conductive structure.

In some examples, in a direction perpendicular to the base substrate, the first surface microstructure and the second conductive structure are not overlapped with each other.

In some examples, the first conductive structure is electrically connected with the second conductive structure through a first via hole running through the first insulating layer; in a direction perpendicular to the base substrate, the first surface microstructure is at least partially overlapped with the first via hole.

In some examples, the first insulating layer comprises a first sub-layer and a second sub-layer that are stacked, and the second sub-layer is farther away from the base substrate than the first sub-layer; and the first sub-layer comprises a first side surface exposed by the first via hole, the second sub-layer comprises a second side surface exposed by the first via hole, and at least one of the first side surface and the second side surface is in direct contact with the third surface of the first conductive structure.

In some examples, an included angle between the first side surface and the base substrate is greater than an included angle between the second side surface and the base substrate.

In some examples, compactness of the second sub-layer is higher than compactness of the first sub-layer.

In some examples, an oxygen content of the first surface is higher than an oxygen content of the third surface.

In some examples, the first surface microstructure has a first end point and a second end point in the first cross section; and distances from a point of the first cross section that is closest to the third surface to the first end point and the second end point are unequal.

In some examples, the first surface microstructure comprises a first concave structure, and the second surface microstructure comprises a second concave structure.

In some examples, the display substrate further comprises a plurality of sub-pixels on the base substrate; the plurality of sub-pixels are arranged as a plurality of pixel columns and a plurality of pixel rows along a first direction and a second direction, the first direction intersecting with the second direction; each of the plurality of sub-pixels comprises a first transistor, a second transistor, a third transistor, and a storage capacitor on the base substrate; a first electrode of the second transistor is electrically connected with a first capacitor electrode of the storage capacitor and a gate electrode of the first transistor, a second electrode of the second transistor is configured to receive a data signal, a gate electrode of the second transistor is configured to receive a first control signal, and the second transistor is configured to write the data signal into the gate electrode of the first transistor and the storage capacitor in response to the first control signal; a first electrode of the first transistor is electrically connected with a second capacitor electrode of the storage capacitor, and is configured to be electrically connected with a first electrode of the light-emitting element, a second electrode of the first transistor is configured to receive a first power supply voltage, and the first transistor is configured to control a current used to drive the light-emitting element under control of a voltage of the gate electrode of the first transistor; and a first electrode of the third transistor is electrically connected with the first electrode of the first transistor and the second capacitor electrode of the storage capacitor, and a second electrode of the third transistor is configured to be connected with a detection circuit.

In some examples, components of a center distance between an orthogonal projection of the first surface microstructure on the base substrate and an orthogonal projection of the second surface microstructure on the base substrate in the first direction and in the second direction are respectively less than average sizes of each of the plurality of sub-pixels in the first direction and the second direction.

In some examples, sub-pixels of each of the plurality of pixel columns emit light of a same color.

In some examples, the first surface microstructure comprises a first concave structure, and the second surface microstructure comprises a second concave structure; the first concave structure and the second concave structure are arranged along an extension direction of the first conductive structure and face sub-pixels of a same color.

In some examples, wherein the display substrate further comprises an extension portion protruding from the gate electrode of the first transistor, the extension portion is extended from the gate electrode of the first transistor along the second direction, and the extension portion is at least partially overlapped with the first electrode of the second transistor and is electrically connected with the first electrode of the second transistor in a direction perpendicular to the base substrate.

In some examples, an active layer of the second transistor comprises a first electrode contact region, a second electrode contact region, and a channel region between the first electrode contact region and the second electrode contact region; and the first electrode of the second transistor is respectively electrically connected with the first electrode contact region, the extension portion, and the first capacitor electrode through a second via hole.

In some examples, the second via hole is extended along the first direction and exposes at least a portion of a surface of the extension portion and two side surfaces, which are opposite in the first direction, of the extension portion.

In some examples, the extension portion spaces the second via hole into a first groove and a second groove; the first electrode of the second transistor fills the first groove and the second groove and covers the two side surfaces of the extension portion; the first electrode of the second transistor comprises a first portion, a second portion and a third portion; and the second portion covers the surface of the extension portion, the first portion covers the first groove, and the third portion covers the second groove; the first portion and the third portion also respectively cover the two side surfaces of the extension portion.

In some examples, the first conductive structure is the first electrode of the second transistor; and the first surface microstructure and the second surface microstructure are both in the third portion of the first electrode of the second transistor.

In some examples, a size of the first surface microstructure in the first direction is less than one-tenth of a maximum size of the third portion along the first direction.

In some examples, a size of the first surface microstructure in the first direction is less than one-tenth of a maximum size of an orthogonal projection of the second via hole on the base substrate in the first direction.

In some examples, each of the plurality of sub-pixels further comprises a light-emitting element, the light-emitting element comprises a first electrode, a light-emitting layer and a second electrode stacked in sequence, and the first electrode is closer to the base substrate than the second electrode; and the first electrode of the light-emitting element is electrically connected with the first electrode of the first transistor of the sub-pixel to which the light-emitting element belongs through a third via hole.

In some examples, the first electrode of the light-emitting element comprises a first electrode portion, a second electrode portion, and a third electrode portion that are sequentially connected in the first direction; the first electrode portion is configured to be electrically connected with the first electrode of a corresponding first transistor and is overlapped with the first electrode of the corresponding first transistor in a direction perpendicular to the base substrate; the third electrode portion of the light-emitting element at least partially overlaps with an opening region of the light-emitting element in the direction perpendicular to the base substrate.

In some examples, a sum of a maximum size of the first electrode portion along the first direction and a maximum size of the first electrode portion along the second direction is less than a sum of a maximum size of the third electrode portion along the first direction and a maximum size of the third electrode portion along the second direction; and a sum of a maximum size of the second electrode portion along the first direction and a maximum size of the second electrode portion along the second direction is less than the sum of the maximum size of the third electrode portion along the first direction and the maximum size the third electrode portion along the second direction.

In some examples, the display substrate comprises a plurality of first surface microstructures and a plurality of second surface microstructures; some of the plurality of first surface microstructures and the plurality of second surface microstructures are overlapped with the first electrode portion in the direction perpendicular to the base substrate, and the others of the plurality of first surface microstructures and the plurality of second surface microstructures are overlapped with the third electrode portion in the direction perpendicular to the base substrate; and distribution density of the first surface microstructures and the second surface microstructures overlapping with the first electrode portion is greater than distribution density of the first surface microstructures and the second surface microstructures overlapping with the third electrode portion.

In some examples, an average size of the second electrode portion of the first electrode of the light-emitting element in the second direction is less than an average size of the first electrode portion in the second direction, and is also less than an average size of the third electrode portion in the second direction.

In some examples, the plurality of pixel rows comprise a first pixel row, and the first pixel row is divided into a plurality of pixel units; each of the plurality of pixel units comprises a first sub-pixel, a second sub-pixel, and a third sub-pixel that are sequentially arranged along the second direction; the first sub-pixel, the second sub-pixel, and the third sub-pixel are respectively configured to emit light of three primary colors; the display substrate further comprises a first scan line extended along the second direction; the first scan line is electrically connected with gate electrodes of second transistors in the first sub-pixel, the second sub-pixel, and the third sub-pixel to supply the first control signal.

In some examples, the first scan line is overlapped with the second electrode portion of the first electrode of the light-emitting element of the first sub-pixel in the direction perpendicular to the base substrate.

In some examples, the display substrate further comprises a color filter layer, wherein the color filter layer is on a side of the first electrode of the light-emitting element close to the base substrate; the color filter layer comprises a plurality of color filter portions respectively corresponding to the first sub-pixel, the second sub-pixel, and the third sub-pixel; and light emitted by the first sub-pixel, the second sub-pixel, and the third sub-pixel is respectively emitted through the corresponding color filter portions to form display light.

In some examples, in the direction perpendicular to the base substrate, the color filter portion corresponding to the first sub-pixel, the color filter portion corresponding to the second sub-pixel, and the second surface microstructure all overlap with each other in the direction perpendicular to the base substrate.

In some examples, in the direction perpendicular to the base substrate, each of the color filter portions is overlapped with the third electrode portion of the first electrode of a light-emitting element of a corresponding sub-pixel, and is not overlapped with the first electrode portion of the first electrode of the light-emitting element of the corresponding sub-pixel.

In some examples, the first scan line is on a side of the color filter layer close to the base substrate; in the direction perpendicular to the base substrate, the second electrode portion of the first electrode of the light-emitting element of the first sub-pixel overlapping with the first scan line also overlaps with the color filter portion corresponding to the first sub-pixel.

In some examples, the first scan line comprises first portions and second portions that are alternately connected; and the second portion is in a ring structure.

In some examples, in the direction perpendicular to the base substrate, the first electrode of the light-emitting element of the first sub-pixel overlaps with the first portion of the first scan line, and does not overlap with the second portion of the first scan line.

In some examples, the display substrate further comprises a plurality of first signal lines extended along the first direction; in the direction perpendicular to the base substrate, the plurality of first signal lines overlap with the second portions of the first scan line to define a plurality of first hollow regions along the second direction.

In some examples, geometric centers of first hollow regions corresponding to each pixel unit are not on a straight line.

In some examples, in the direction perpendicular to the base substrate, the color filter portion corresponding to the first sub-pixel is overlapped with at least one of the plurality of first hollow regions; and the color filter portion corresponding to the second sub-pixel is overlapped with none of the plurality of first hollow regions.

In some examples, in the direction perpendicular to the base substrate, the color filter portion corresponding to the first sub-pixel is overlapped with one of the plurality of first hollow regions with a first overlap area; the color filter portion corresponding to the second sub-pixel is overlapped with another of the plurality of first hollow regions with a second overlap area; and the first overlap area is different from the second overlap area.

In some examples, an absolute value of a difference value between the first overlap area and the second overlap area is greater than (n*λ)2, where λ is a greater value of wavelengths of light emitted by the first sub-pixel and the second sub-pixel.

In some examples, the display substrate comprises a plurality of first surface microstructures and a plurality of second surface microstructures; and some of the plurality of first surface microstructures and the plurality of second surface microstructures are overlapped with the first portions of the first scan line in the direction perpendicular to the base substrate; and the others of the plurality of first surface microstructures and the plurality of second surface microstructures are overlapped with the second portions of the first scan line in the direction perpendicular to the base substrate; in the direction perpendicular to the base substrate, distribution density of the first surface microstructures and the second surface microstructures overlapping with the second portions of the first scan line is greater than distribution density of the first surface microstructures and the second surface microstructures overlapping with the first portions of the first scan line.

In some examples, the first overlap area is greater than an area of an orthogonal projection of each of the plurality of first surface microstructures or second surface microstructures on the base substrate; the second overlap area is greater than an area of an orthogonal projection of each of the plurality of first surface microstructures or second surface microstructures on the base substrate.

In some examples, the pixel unit further comprises a fourth sub-pixel, and the fourth sub-pixel is configured to emit white light; none of first hollow regions close to the fourth sub-pixel among the plurality of first hollow regions is overlapped with the color filter layer in the direction perpendicular to the base substrate.

In some examples, the plurality of signal lines comprise a plurality of data lines, and the plurality of data lines are connected in one-to-one correspondence with the plurality of pixel columns; for the first pixel row, the plurality of data lines are divided into a plurality of data line groups in one-to-one correspondence with the plurality of pixel units; each of the plurality of data line groups comprises a first data line, a second data line and a third data line respectively connected with the first sub-pixel, the second sub-pixel, and the third sub-pixel; for each of the plurality of pixel units, the first data line, the second data line and the third data line in corresponding connection with the each pixel unit are all located between the first sub-pixel and the third sub-pixel.

In some examples, the display substrate further comprises a plurality of power lines extended along the first direction; the plurality of power lines are configured to supply a first power supply voltage to the plurality of sub-pixels; an between each of the plurality of power lines and any one of the plurality of data lines is provided with at least one pixel column.

In some examples, the display substrate comprises a plurality of first surface microstructures and a plurality of second surface microstructures; some of the plurality of first surface microstructures and the plurality of second surface microstructures are distributed on the plurality of data lines, the others of the plurality of first surface microstructures and the plurality of second surface microstructures are distributed on the plurality of power lines; distribution density of the plurality of first surface microstructures and the plurality of second surface microstructures on the plurality of data lines is greater than distribution density of the plurality of first surface microstructures and the plurality of second surface microstructures on the plurality of power lines.

In some examples, the second sub-pixel is directly adjacent to the third sub-pixel, and the third sub-pixel has a first side and a second side opposite to each other in the second direction; and the second data line and the third data line are located on the first side of the third sub-pixel and located between the second sub-pixel and the third sub-pixel.

In some examples, the second electrode portion of the first electrode of the light-emitting element of the third sub-pixel is concave relative to the first electrode portion and the third electrode portion of the first electrode of the light-emitting element of the third sub-pixel in a direction away from the second side of the third sub-pixel.

In some examples, in the direction perpendicular to the substrate, the second data line and the third data line are respectively at least partially overlapped with the color filter layer.

In some examples, the pixel unit further comprises a fourth sub-pixel, and the fourth sub-pixel is configured to emit white light; each of the data line groups further comprises a fourth data line connected with the fourth sub-pixel; and in the direction perpendicular to the base substrate, the fourth data line does not overlap with the color filter layer.

In some examples, the plurality of pixel rows further comprise a second pixel row, and the second pixel row is directly adjacent to the first pixel row in the first direction; the second pixel row comprises a fifth sub-pixel, a sixth sub-pixel, and a seventh sub-pixel that are sequentially arranged along the second direction; the fifth sub-pixel and the first sub-pixel are located in a same pixel column; the sixth sub-pixel and the second sub-pixel are located in a same pixel column; and the seventh sub-pixel and the third sub-pixel are located in a same pixel column.

In some examples, the color filter portion corresponding to the first sub-pixel has a side edge close to the fifth sub-pixel, and the side edge is parallel to the second direction.

In some examples, the display substrate further comprises a second scan line extended along the second direction; and the second scan line is electrically connected with gate electrodes of third transistors in the fifth sub-pixel, the sixth sub-pixel and the seventh sub-pixel to supply a second control signal.

In some examples, the second scan line comprises first portions and second portions that are alternately connected; and the second portion is a ring structure.

In some examples, in the direction perpendicular to the base substrate, the plurality of first signal lines are overlapped with the second portions of the second scan line to define a plurality of second hollow regions sequentially arranged in the second direction.

In some examples, the first conductive structure is one of the plurality of first signal lines, the first surface microstructure and the second surface microstructure are located on the first signal line, and the first surface microstructure at least partially overlaps with the second hollow region corresponding to the first signal line in the direction perpendicular to the base substrate.

In some examples, in the direction perpendicular to the base substrate, the color filter portion corresponding to the first sub-pixel overlaps with one second hollow region of the plurality of second hollow regions with a third overlap area; the color filter portion corresponding to the second sub-pixel overlaps with another second hollow region of the plurality of second hollow regions with a fourth overlap area; the third sub-pixel overlaps with still another second hollow region of the plurality of second hollow regions with a fifth overlap area; and the third overlap area, the fourth overlap area, and the fifth overlap area are all different from each other.

In some examples, the second electrode of the third transistor is electrically connected with a detection portion extended along the second direction through a fourth via hole; and the detection portion is electrically connected with a detection line extended along the first direction, so that the second electrode of the third transistor is connected with the detection circuit through the detection portion and the detection line.

In some examples, the first conductive structure is the second electrode of the third transistor, the first surface microstructure and the second surface microstructure are located on the second electrode of the third transistor, and the first surface microstructure at least partially overlaps with the fourth via hole in the direction perpendicular to the base substrate.

In some examples, the active layer of the third transistor comprises a first electrode contact region, a second electrode contact region, and a channel region between the first electrode contact region and the second electrode contact region; and the first electrode of the third transistor is electrically connected with the first electrode contact region of the third transistor through a fifth via hole.

In some examples, the first conductive structure is the first electrode of the third transistor, the first surface microstructure and the second surface microstructure are on the first electrode of the third transistor, and the first surface microstructure at least partially overlaps the fifth via hole in the direction perpendicular to the base substrate.

At least an embodiment of the present disclosure further provides a display substrate, comprising a base substrate and a first conductive structure on the base substrate. The first conductive structure comprises a first surface and a second surface away from the base substrate; the first surface and the second surface are made of a same material; the first surface is provided with a first surface microstructure, and the second surface is provided with a second surface microstructure; the first surface microstructure has a first cross section perpendicular to the base substrate, and the second surface microstructure has a second cross section perpendicular to the base substrate; the first surface microstructure has a first end point and a second end point in the first cross section; and the second surface microstructure has a third end point and a fourth end point in the second cross section; and a distance from a midpoint of a connection line between the first end point and the second end point to a plate surface of the base substrate is different from a distance from a midpoint of a connection line between the third end point and the fourth end point to the plate surface of the base substrate.

In some examples, a minimum thickness of the first conductive structure at the first surface microstructure is less than an average thickness of the first conductive structure and greater than 3/5 of the average thickness of the first conductive structure.

In some examples, the first conductive structure further comprises a third surface and a fourth surface close to the base substrate; in a direction perpendicular to the base substrate, the first surface microstructure at least partially overlaps with the third surface, and the second surface microstructure at least partially overlaps with the fourth surface.

In some examples, at least one of the third surface and the fourth surface is a flat surface.

In some examples, an area of an orthogonal projection of the first surface microstructure on the third surface is less than a surface area of the first surface microstructure; and an area of an orthogonal projection of the second surface microstructure on the fourth surface is less than a surface area of the second surface microstructure.

In some examples, the first surface microstructure further has a first intermediate point between the first end point and the second end point in the first cross section; and the second surface microstructure further has a second intermediate point between the third end point and the fourth end point in the second cross section; a distance between the first intermediate point and the third surface is equal to neither a distance between the first end point and the third surface nor a distance between the second end point and the third surface; a distance between the second intermediate point and the fourth surface is equal to neither a distance between the third end point and the fourth surface, nor a distance between the fourth end point and the fourth surface.

In some examples, the first surface has a first included angle with the plate surface of the base substrate, the second surface has a second included angle with the plate surface of the base substrate, and the first included angle is different from the second included angle.

In some examples, the first included angle is greater than 0 degrees; and the second included angle is equal to 0 degrees.

In some examples, the display substrate further comprises a first insulating layer on a side of the first conductive structure close to the base substrate; the first insulating layer comprises a first portion in direct contact with the third surface of the first conductive structure and a second portion in direct contact with the fourth surface of the first conductive structure; and a minimum thickness of the first portion is less than a minimum thickness of the second portion.

In some examples, the display substrate further comprises a second conductive structure on a side of the first insulating layer close to the base substrate; the first portion of the first insulating layer covers at least a portion of the second conductive structure.

In some examples, in a direction perpendicular to the base substrate, the first surface microstructure and the second conductive structure are not overlapped with each other.

In some examples, the first conductive structure is electrically connected with the second conductive structure through a first via hole running through the first insulating layer; and in a direction perpendicular to the base substrate, the first surface microstructure at least partially overlaps with the first via hole.

In some examples, the first insulating layer comprises a first sub-layer and a second sub-layer that are stacked, and the second sub-layer is farther away from the base substrate than the first sub-layer; and the first sub-layer comprises a first side surface exposed by the first via hole, the second sub-layer comprises a second side surface exposed by the first via hole, and at least one of the first side surface and the second side surface is in direct contact with the third surface of the first conductive structure.

In some examples, an included angle between the first side surface and the base substrate is greater than an included angle between the second side surface and the base substrate.

In some examples, compactness of the second sub-layer is higher than compactness of the first sub-layer.

In some examples, an oxygen content of the first surface is higher than an oxygen content of the third surface.

At least an embodiment of the present disclosure further provides a display apparatus, comprising the display substrate provided by any one of the above embodiments.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1A:
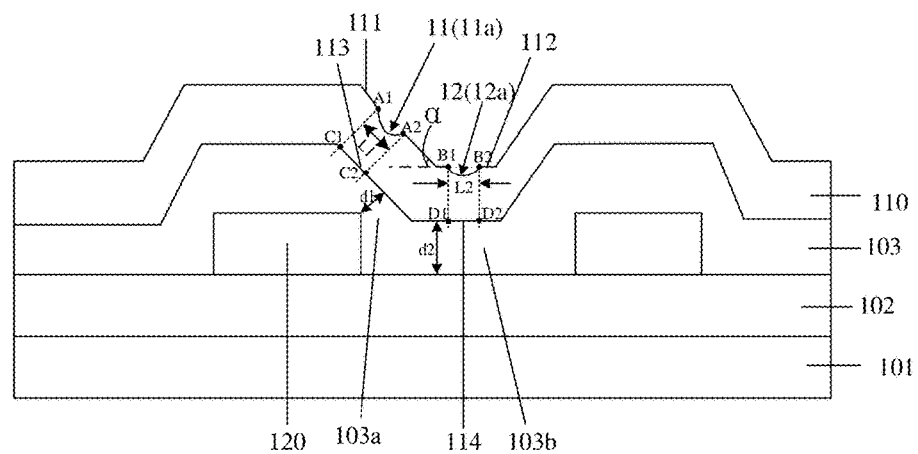
FIG. 1A is a first schematic diagram I of a display substrate provided by at least one embodiment of the present disclosure.

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," and the like are only used to indicate relative position relationship, and when the position of the described object is changed, the relative position relationship may be changed accordingly.

With development of a display panel toward thinness and lightness, especially in large-size display applications, the display panel is prone to defects due to external stress; for example, during a fabrication or use process, fracture easily occurs to a signal line in the display panel under an action of external stress, causing disfunction to the panel.

At least an embodiment of the present disclosure provides a display substrate, comprising a base substrate and a first conductive structure on the base substrate. The first conductive structure comprises a first surface and a second surface away from the base substrate, and the first surface and the second surface are made of a same material; the first surface has a first included angle with a plate surface of the base substrate, the second surface has a second included angle with the plate surface of the base substrate, and the first included angle is different from the second included angle; the first surface is provided with a first surface microstructure, and the second surface is provided with a second surface microstructure; the first conductive structure further comprises a third surface and a fourth surface close to the base substrate, the third surface is opposite to the first surface, and the fourth surface is opposite to the second surface; the first surface microstructure has a first cross section perpendicular to the base substrate, the first cross section has a first orthogonal projection on the third surface, and a length of the first orthogonal projection is less than a length of the first cross section; and the second surface microstructure has a second cross section perpendicular to the base substrate, the second cross section has a second orthogonal projection on the fourth surface, and a length of the second orthogonal projection is less than a length of the second cross section. In a display substrate provided by an embodiment of the present disclosure, a first surface microstructure and a second surface microstructure are respectively provided on a first surface and a second surface of a first conductive structure, so that the first conductive structure may have stress released at different angles or in different directions, to avoid stress concentration that leads to panel failure.

By providing the first surface microstructure on the first surface and the second surface microstructure on the second surface of the first conductive structure, the display substrate provided by the embodiments of the present disclosure can enable the first conductive structure to release stress from different angles or different directions, thereby preventing the display substrate from failure caused by the stress concentration.

The first surface microstructure and the second surface microstructure according to the embodiment of the present disclosure may be implemented in a variety of specific structures, which are not limited in the present disclosure. For example, the first stress structure and the second surface microstructure are grooves, protrusions or via holes, and these structures can effectively increase a surface area of the conductive structure, thereby helping to relieve stress.

FIG. 1A shows a schematic diagram of a display substrate 10 provided by at least one embodiment of the present disclosure. As shown in FIG. 1A, the display substrate 10 comprises a first conductive structure 110 located on a base substrate 101, the first conductive structure 110 comprises a first surface 111 and a second surface 112 that face away from the base substrate 101, the first surface 111 and a plate surface of the base substrate 101 have a first included angle α, and the second surface 112 and the plate surface of the base substrate 101 have a second included angle, and the first included angle is different from the second included angle. For example, the first included angle α is greater than 0, that is, the first surface 111 is an inclined surface; for example, the second included angle is 0, that is, the second surface 112 is parallel to the plate surface of the base substrate. The first surface 111 is provided thereon with a first surface microstructure 11; and the second surface 112 is provided thereon with a second surface microstructure 12.

For example, a maximum size of an orthogonal projection of the first surface microstructure 11 on the first surface 111 is greater than a maximum size of an orthogonal projection of the second surface microstructure 12 on the second surface 112. For example, a maximum size of the first surface microstructure 11 in a direction perpendicular to the first surface 111 is greater than a maximum size of the second surface microstructure 12 in a direction perpendicular to the second surface 112. Because the first surface 111 is more inclined with respect to the base substrate than the second surface 112, and has stress more concentrated, setting the size of the first surface microstructure 11 to be greater helps release stress more uniformly.

For example, the maximum size of the orthogonal projection of the first surface microstructure 11 on the first surface 111 is 0.15 microns to 0.35 microns, for example, 0.22 microns to 0.28 microns; in the direction perpendicular to the first surface 111, the maximum size of the first surface microstructure 11 ranges from 0.03 microns to 0.1 microns, for example, 0.05 microns to 0.08 microns. For example, a line width of the first conductive structure ranges from 5 microns to 30 microns. For example, the maximum size of the first surface microstructure 11 in the direction perpendicular to the first surface 111 is 5% to 20% of an average thickness of the first conductive structure.

For example, the maximum size of the orthogonal projection of the second surface microstructure 12 on the second surface 112 is 0.1 microns to 0.2 microns, for example, 0.12 microns to 0.15 microns; in the direction perpendicular to the second surface 112, the maximum size of the second surface microstructure 12 ranges from 0.02 microns to 0.08 microns, for example, from 0.03 microns to 0.07 microns. The line width of the first conductive structure ranges from 5 microns to 30 microns. For example, the maximum size of the second surface microstructure 12 in the direction perpendicular to the second surface 112 is 5% to 20% of the average thickness of the first conductive structure.

Such arrangement may allow the surface microstructures to effectively release stress while preventing the first conductive structure from being defective due to arrangement of the surface microstructures. As shown in FIG. 1A, the first conductive structure 110 further comprises a third surface 113 and a fourth surface 114 close to the base substrate 101; the third surface 113 is opposite to the first surface 111; and the fourth surface 114 is opposite to the second surface 112.

The first surface microstructure 11 has a first cross section 11a perpendicular to the base substrate, and the second surface microstructure has a second cross section 12a perpendicular to the base substrate. For example, as shown in FIG. 1A, the first cross section 11a and the second cross section 12a are both located within a paper plane. The first cross section 11a has a first orthogonal projection (C1C2) on the third surface 113, and a length of the first orthogonal projection is less than a length of the first surface microstructure 11 in the first cross section 11a, that is, a length of a curve A1A2. The second surface microstructure 12 has a second cross section 12a on a first projection plane; the second cross section 12a has a second orthogonal projection (D1D2) on the fourth surface 114; and a length of the second orthogonal projection is less than a length of the second surface microstructure 12 in the second cross section 12a, that is, a length of a curve B1B2.

The curve A1A2 or B1B2 may effectively increase surface areas of the first surface microstructure 11 or the second surface microstructure 12, thereby improving stress release capability of the first surface microstructure 11 and the second surface microstructure 12. For example, the curve A1A2 and/or the curve B1B2 comprise arcs, so that stress is released more uniformly.

Both the first cross section 11a and the second cross section 12a are projected into a linear structure (a one-dimensional structure); and the linear structure is related to shapes of the third surface and the fourth surface. In the case where the third surface and the fourth surface are flat surfaces, the first orthogonal projection and the second orthogonal projection are respectively straight lines, as shown in FIG. 1A; in the case where the third surface and the fourth surface are curved surfaces, the first orthogonal projection and the second orthogonal projection are respectively curves.

For example, it should be noted that, in the case where a projection plane is a curved surface, an orthogonal projection of a certain structure on the projection plane is a projection of the structure on the projection plane along a direction of a normal of each point in the projection plane.

For example, at least one of the third surface 113 and the fourth surface 114 is a flat surface. As shown in FIG. 1A, the third surface 113 and the fourth surface 114 are both flat surfaces. In a direction perpendicular to the base substrate 101, the first surface microstructure 11 at least partially overlaps with the third surface 113, and the second surface microstructure 12 at least partially overlaps with the fourth surface 114.

It should be noted that, flatness of the third surface 113 and the fourth surface 114 is relative to a scale of the first surface microstructure 11 or the second surface microstructure 12; and a scale for judging flatness of the third surface 113 and the fourth surface 114 should be on a same order as the scale of the first surface microstructure 11 or the second surface microstructure 12. For example, a judgment scale in a direction parallel to the third surface 113 or the fourth surface 114 is on an order of 0.1 micron, and a judgment scale in a direction perpendicular to the third surface 113 or the fourth surface 114 is on an order of a 0.01 micron. For example, in the case where the third surface 113/fourth surface 114 has a concave or convex structure with a size reaching an order of 0.1 micron in a parallel direction and a size reaching an order of 0.01 micron in a vertical direction, it is judged that the third surface 113/fourth surface 114 are non-flat surfaces.

For example, an area of an orthogonal projection of the first surface microstructure 11 on the third surface 113 is less than a surface area of the first surface microstructure; and an area of an orthogonal projection of the second surface microstructure 12 on the fourth surface 114 is less than a surface area of the second surface microstructure. Such arrangement increases a surface area of the first conductive structure, which helps to release stress.

For example, along an extension direction of the first conductive structure, the first surface microstructure has a first end point, a first intermediate point, and a second end point; and the second surface microstructure has a third end point, a second intermediate point, and a fourth intermediate point; a distance between the first intermediate point and the third surface is equal to neither a distance between the first end point and the third surface nor a distance between the second end point and the third surface; a distance between the second intermediate point and the fourth surface is equal to neither a distance between the third end point and the fourth surface, nor a distance between the fourth end point and the fourth surface.

For example, as shown in FIG. 1A, the first surface microstructure 11 and the second surface microstructure 12 respectively comprise a first concave structure and a second concave structure; and the first concave structure is concave relative to a reference plane where the first surface 111 is located; the second concave structure is concave relative to a reference plane where the second surface 112 is located. The concave structure increases the surface area of the first conductive structure 110, which helps release stress, and reduces a risk of fracture as the first conductive structure 110 is subjected to stress.

As shown in FIG. 1A, the first concave structure and the second concave structure respectively face different orientations. For example, an orientation of the first concave structure may be defined as a direction perpendicular to the first surface 111; and an orientation of the second concave structure may be defined as a direction perpendicular to the second surface 112. This helps disperse stress on the first conductive structure 110 and further reduce a risk of defects. For example, a maximum depth of the concave structure is one-tenth to two-fifths of a thickness of the first conductive structure at the concave structure.

For example, a minimum thickness of the first conductive structure at the first surface microstructure is less than an average thickness of the first conductive structure and greater than ⅗ of the average thickness of the first conductive structure.

For example, as shown in FIG. 1A, the first surface microstructure 11 has a first end point A1 and a second end point A2 in the first cross section 11a; and the second surface microstructure 12 has a third end point B1 and a fourth end point B2 in the second cross section 12a. A distance from a midpoint (not shown) of a line segment between the first end point A1 and the second end point A2 to the plate surface of the base substrate 101 is different from a distance from a midpoint (not shown) of a line segment between the third end point B1 and the fourth end point B2 to the plate surface of the base substrate 101. Such arrangement allows the first surface microstructure 11 and the second surface microstructure 12 to have different heights relative to the base substrate, which helps further disperse stress on the first conductive structure 110 and reduce a risk of defects.

For example, a distance L1 between the first end point A1 and the second end point A2 is greater than a distance L2 between the third end point B1 and the fourth end point B2. For example, a maximum size of the first concave structure in the direction perpendicular to the first surface 111 is greater than a maximum size of the second concave structure in the direction perpendicular to the second surface 112.

For example, the distance L1 between the first end point A1 and the second end point A2 and the distance L2 between the third end point B1 and the fourth end point B2 are respectively greater than 0.1 micron and less than 1 micron.

For example, the distance L1 between the first end point A1 and the second end point A2 is greater than the distance L2 between the third end point B1 and the fourth end point B2; that is, a length of the first surface microstructure on the inclined surface is greater.

For example, the distance L1 between the first end point A1 and the second end point A2 is 0.15 microns to 0.35 microns, for example, 0.22 microns to 0.28 microns; for example, the maximum size of the first concave structure in the direction perpendicular to the first surface 111 is 0.03 microns to 0.1 microns, for example, 0.05 microns to 0.08 microns. The size ranges not only ensure that the conductive structure is not broken, but also can fully release stress.

For example, the distance L2 between the third end point B1 and the fourth end point B2 is 0.1 microns to 0.2 microns, for example, 0.12 microns to 0.15 microns; for example, the maximum size of the second concave structure in the direction perpendicular to the second surface 112 ranges from 0.02 microns to 0.08 microns, for example, 0.03 microns to 0.07 microns.

Since the first surface 111 is more inclined relative to the base substrate than the second surface 112, and stress is more concentrated, setting the first concave structure to a greater size helps release stress more uniformly. In addition, setting the first concave structure and the second concave structure to the above-described sizes not only ensures no breakage occurring to the conductive structure, but also can fully release stress.

In at least one embodiment, as shown in FIG. 1A, the first surface microstructure 11 has the first end point A1 and the second end point A2 in the first cross section 11a; and the second surface microstructure 12 has the third end point B1 and the fourth end point B2 in the second cross section 12a; a distance from a midpoint of a connection line between the first end point A1 and the second end point A2 to the plate surface of the base substrate 101 is different from a distance from a midpoint of a connection line between the third end point B1 and the fourth end point B2 to the plate surface of the base substrate 101.

Such arrangement allows the first surface microstructure 11 and the second surface microstructure 12 to have different heights relative to the base substrate, which helps further disperse stress on the first conductive structure 110 and reduce a risk of defects. For example, roughness of the first surface 111 is higher than roughness of the third surface 113; and roughness of the second surface 112 is higher than roughness of the fourth surface 114. Such arrangement may improve direct adhesion between the first conductive structure 110 and an insulating layer located thereon, and may prevent the insulating layer from falling off. For example, a surface on a side of the first conductive structure 110 that is away from the base substrate may be slightly oxidized during a fabrication process to increase roughness of the surface, thereby increasing roughness of the first surface and the second surface. For example, an oxygen content of the first surface 111 is higher than that of the third surface 113; and an oxygen content of the second surface 112 is higher than that of the fourth surface 114.

For example, as shown in FIG. 1A, the display substrate 10 further comprises a first insulating layer 103 located on a side of the first conductive structure 110 that is close to the base substrate 101; the first insulating layer 103 comprises a first portion 103a and a second portion 103b respectively in direct contact with the third surface 113 and the fourth surface 114 of the first conductive structure 110; a minimum thickness d1 of the first portion 103a is less than a minimum thickness d2 of the second portion 103b. It should be noted that, as shown in FIG. 1A, the thickness here refers to a size of the first insulating layer 103 in a direction perpendicular to a surface of the film layer. Since the third surface 113 is an inclined surface, such arrangement reduces a thickness of the first portion 103 of the first insulating layer 103, which helps reduce a climbing difficulty of the first portion 103a of the first insulating layer 103, thereby reducing a breakage risk of the first conductive structure 110.

For example, a point of the first surface microstructure that is closest to the third surface is neither the first end point nor the second end point, and has unequal distances to the first end point and the second end point.

For example, as shown in FIG. 1A, the first concave structure comprises a smooth curved surface, that is, an included angle between a tangent of the curved surface and the base substrate 101 changes continuously; in a direction away from the base substrate 101, a change rate of the included angle between the tangent of the curved surface and the base substrate 101 increases gradually, that is, the first concave structure is asymmetric, and a slope angle at an upstream (on a side away from the base substrate) is less than a slope angle at a downstream (on a side close to the base substrate).

Since the upstream concave surface reflects light from above more easily, such arrangement allows the first conductive structure to better reflect light emitted by a light-emitting element located on a side of the first conductive structure that is away from the base substrate, thereby improving light utilization efficiency. This will be described in detail later in conjunction with a specific structure of the display substrate.

For example, as shown in FIG. 1A, the second concave structure comprises a smooth curved surface; the curved surface is, for example, a symmetric structure, that is, an included angle between a tangent of the curved surface and the base substrate 101 changes continuously with a change rate remaining unchanged. Such arrangement helps release stress uniformly on the plane.

As shown in FIG. 1A, the display substrate 10 further comprises a second conductive structure 120 located on a side of the first insulating layer 103 that is close to the base substrate, for example, the first insulating layer 103 spaces apart the first conductive structure 110 and the second conductive structure 120. For example, the first insulating layer 103 is formed on the second conductive structure 102, and the first surface 111 of the first insulating layer 103 is formed as an inclined surface due to existence of the second conductive structure 102.

For example, in the direction perpendicular to the base substrate 101, the first surface microstructure 11 does not overlap with the second conductive structure 120. Since stress at the first surface microstructure 11, especially at a deepest portion of the first surface microstructure 11, is relatively concentrated, the first surface microstructure 11 is set not to overlap with the second conductive structure 120, which reduces a short circuit risk between the first conductive structure 110 and the second conductive structure 120 caused by fracture at the first surface microstructure 11.

For example, as shown in FIG. 1A, the display substrate 10 further comprises a buffer layer 102 located on a side of the second conductive structure 120 that is close to the base substrate, for example, the buffer layer 102 is in direct contact with the base substrate 101. The buffer layer 102 helps improve flatness of the base substrate 101 and improve adhesion of the second conductive structure 120 to the base substrate 101. In the case where the base substrate 101 is an organic flexible substrate, the buffer layer 102 may also effectively isolate external oxygen or moisture to protect a circuit structure on the substrate.

Figure 1B:
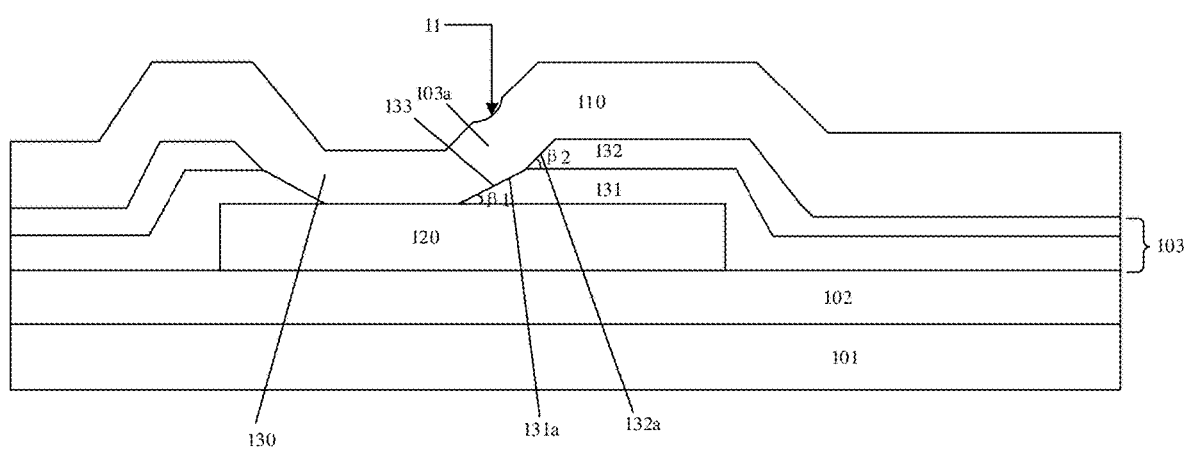
FIG. 1B is a schematic diagram II of a display substrate provided by at least one embodiment of the present disclosure.

FIG. 1B is a schematic diagram of a display substrate provided by another embodiment of the present disclosure, and only the first surface microstructure 11 is shown in the diagram. As shown in FIG. 1B, the first conductive structure 110 is electrically connected with the second conductive structure 120 through a via hole 130 in the insulating layer 103; and the via hole 130 at least partially overlaps with the first surface microstructure 11 in the direction perpendicular to the base substrate 101.

Since stress at the via hole is relatively concentrated, arranging the surface microstructure 11 corresponding to the via hole 130 may help relieve stress at the via hole and reduce a risk of disconnection.

As shown in FIG. 1B, the first insulating layer 103 comprises a first sub-layer 131 and a second sub-layer 132 that are stacked; and the second sub-layer 132 is farther away from the base substrate 101 than the first sub-layer 131. The via hole 130 runs through the first sub-layer 131 and the second sub-layer 132. The first sub-layer 131 comprises a first side surface 131a exposed by the via hole 130; the second sub-layer 132 comprises a second side surface 132a exposed by the via hole 130; and at least one of the first side surface 131a and the second side surface 132a is in direct contact with the third surface 133 of the first conductive structure 130. As shown in FIG. 1B, the first side surface 131a is in direct contact with the third surface 133 of the first conductive structure 130.

As shown in FIG. 1B, an included angle (a slope angle) between the first side surface 131a and the base substrate 101 is $\beta1$; an included angle between the second side surface 132a and the base substrate 101 is $\beta2$; and $\beta1$ is less than $\beta2$.

Such arrangement, on the one hand, may retard a gradient of slope of the first insulating layer 103 at the via hole 130, thereby preventing the via hole from being too steep causing a risk of disconnection, and on the other hand, may prevent the via hole from being too mild causing the via hole to take up too much space.

For example, during a fabrication process, the first sub-layer 131 may be formed by a high-temperature deposition process; and the second sub-layer 132 may be formed by a low-temperature deposition process, so that compactness of the second sub-layer 132 is higher than compactness of the first sub-layer 131; and then the first insulating layer is etched by a dry etching process, so that the slope angle of the first sub-layer 131 is less than the slope angle of the second sub-layer 132.

Figure 2A:
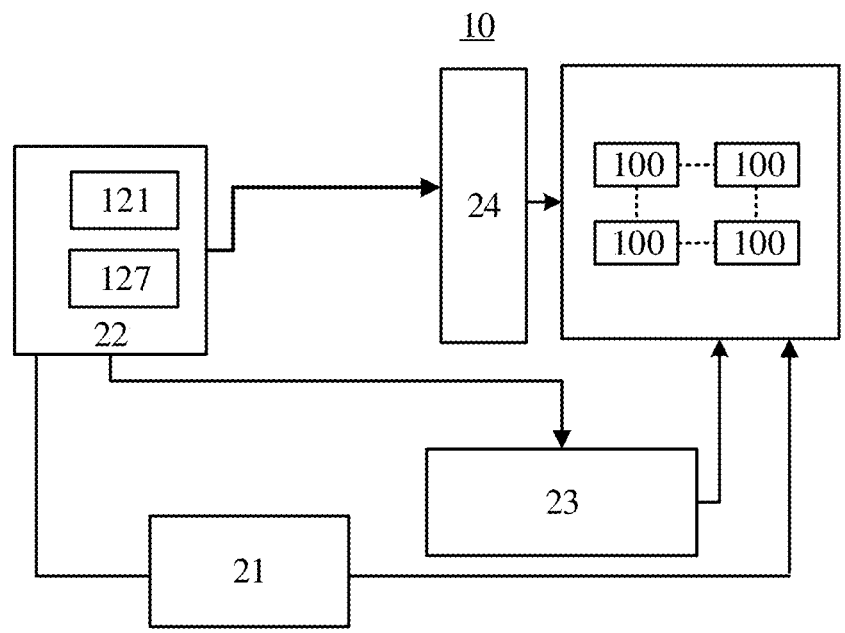
FIG. 2A is a schematic diagram III of a display substrate provided by at least one embodiment of the present disclosure.

FIG. 2A is a block diagram of a display substrate provided by at least one embodiment of the present disclosure. As shown in FIG. 2A, the display substrate 10 comprises a plurality of sub-pixels 100 arranged in an array, for example, each sub-pixel 100 comprises a light-emitting element and a pixel circuit that drives light-emitting element to emit light. For example, the display substrate is an Organic Light-Emitting Diode (OLED) display substrate, and the light-emitting element is an OLED. The display substrate may further comprise a plurality of scan lines and a plurality of data lines configured to supply scan signals (control signals) and data signals to the plurality of sub-pixels, so as to drive the plurality of sub-pixels. As required, the display substrate may further comprise a power line, a detection line, etc.

The pixel circuit comprises a driving sub-circuit configured to drive the light-emitting element to emit light and a detecting sub-circuit configured to detect electrical characteristics of the sub-pixel, so as to implement external compensation. A specific structure of the pixel circuit will not be limited in the embodiment of the present disclosure.

Figure 2B:
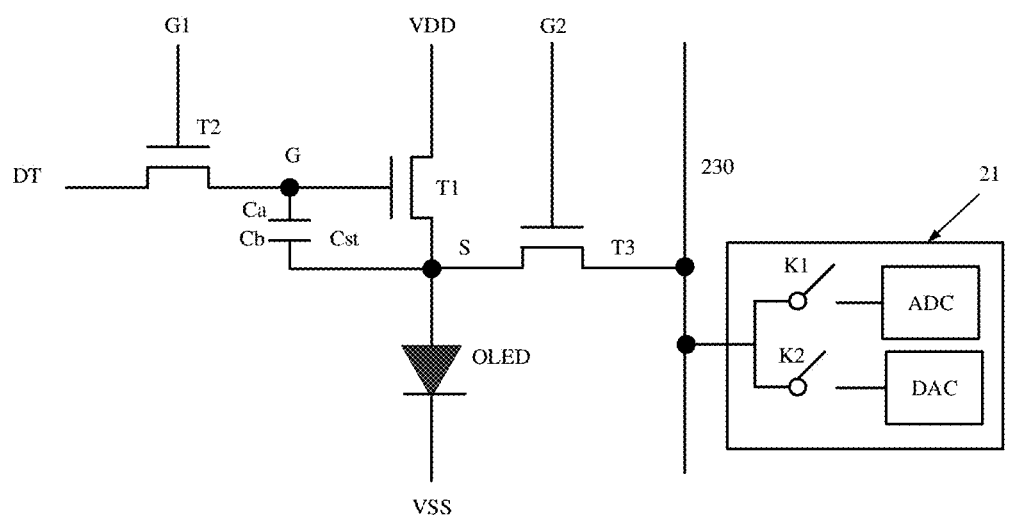
FIG. 2B is a pixel circuit diagram I in a display substrate provided by at least one embodiment of the present disclosure.

FIG. 2B shows a schematic diagram of a 3T1C pixel circuit used in the display substrate. As required, the pixel circuit may further comprise a compensation circuit, a reset circuit, etc., which will not be limited in the embodiment of the present disclosure.

Referring to FIG. 2A and FIG. 2B together, the pixel circuit comprises a first transistor T1, a second transistor T2, a third transistor T3, and a storage capacitor Cst. A first electrode of the second transistor T2 is electrically connected with a first capacitor electrode of the storage capacitor Cst and a gate electrode of the first transistor T1, a second electrode of the second transistor T2 is configured to receive a data signal GT, the second transistor T2 is configured to write the data signal DT into the gate electrode of the first transistor T1 and the storage capacitor Cst in response to a first control signal G1; a first electrode of the first transistor T1 is electrically connected with a second capacitor electrode of the storage capacitor Cst, and is configured to be electrically connected with a first electrode of the light-emitting element, a second electrode of the first transistor T1 is configured to receive a first power supply voltage V1 (e.g., a high power supply voltage VDD), and the first transistor T1 is configured to control a current used to drive the light-emitting element under control of a voltage of the gate electrode of the first transistor T1; a first electrode of the third transistor T3 is electrically connected with the first electrode of the first transistor T1 and the second capacitor electrode of the storage capacitor Cst, a second electrode of the third transistor T3 is configured to be connected with a detection line 230 so as to be coupled to an external detection circuit 21, the third transistor T3 is configured to detect electrical characteristics of a sub-pixel to which it belongs in response to a second control signal G2, so as to implement external compensation; and the electrical characteristics comprise, for example, a threshold voltage and/or carrier mobility of the first transistor T1, or a threshold voltage, a driving current, etc. of the light-emitting element. The external detection circuit 21 is, for example, a conventional circuit comprising a Digital-to-Analog Converter (DAC) and an Analog-to-Digital Converter (ADC), etc., and no details will be repeated in the embodiment of the present disclosure.

The transistors adopted in the embodiments of the present disclosure may all be thin film transistors or field effect transistors or other switching devices with same characteristics; and the embodiments of the present disclosure are all described by taking thin film transistors as an example. A source electrode and a drain electrode of the transistor adopted here may be symmetrical in structure, so the source electrode and the drain electrode of the transistor may be structurally indistinguishable. In the embodiments of the present disclosure, in order to distinguish two electrodes of a transistor other than a gate electrode, one electrode is directly described as a first electrode, and the other electrode as a second electrode. In addition, a transistor may be categorized into an N-type transistor or a P-type transistor according to characteristics of the transistor. When a transistor is a P-type transistor, an On voltage is a low-level voltage (e.g., 0 V, −5 V, −10 V or other suitable voltage), and an OFF voltage is a high-level voltage (e.g., 5 V, 10 V or other suitable voltage)); when the transistor is an N-type transistor, an ON voltage is a high-level voltage (e.g., 5 V, 10 V or other suitable voltage), and an OFF voltage is a low-level voltage (e.g., 0 V, −5 V, −10 V or other suitable voltage). It should be noted that, description below is given by taking the transistor in FIG. 2B as an N-type transistor, but it is not a limitation of the present disclosure.

Figure 2C:
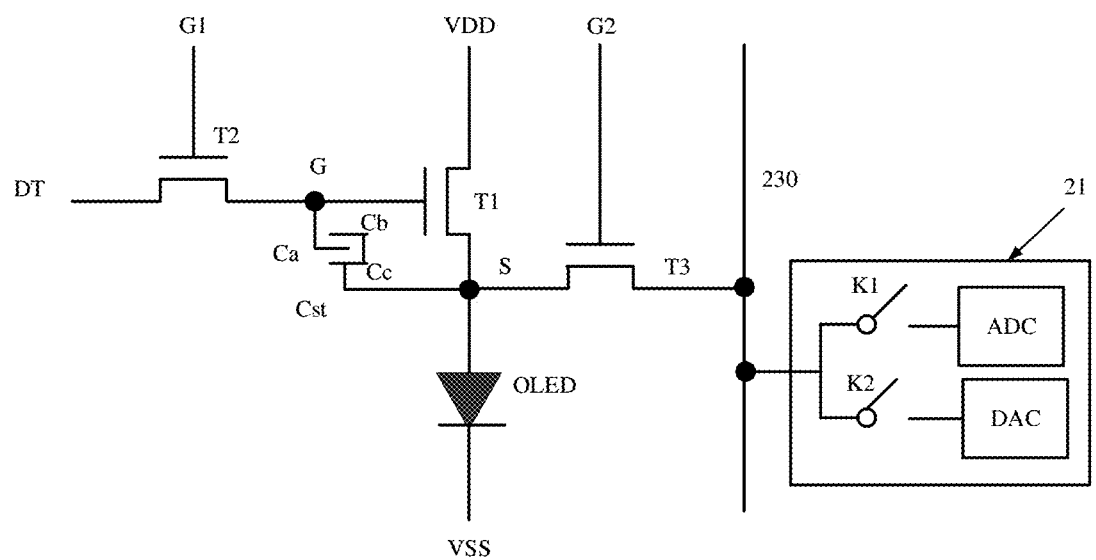
FIG. 2C is a pixel circuit diagram II in a display substrate provided by at least one embodiment of the present disclosure.
Figure 2D:
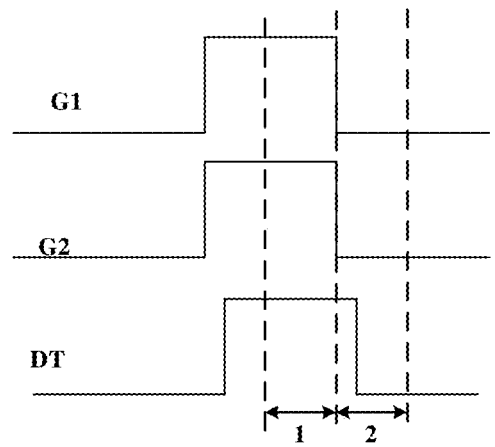
FIG. 2D to FIG. 2F are signal timing diagrams of a pixel circuit driving method provided by an embodiment of the present disclosure.
Figure 2E:
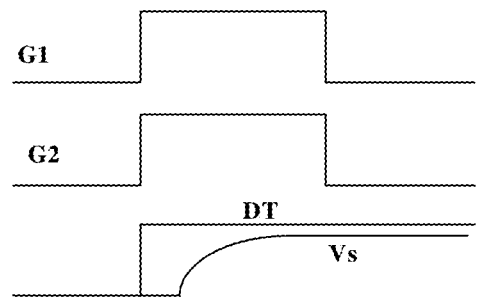
Figure 2F:
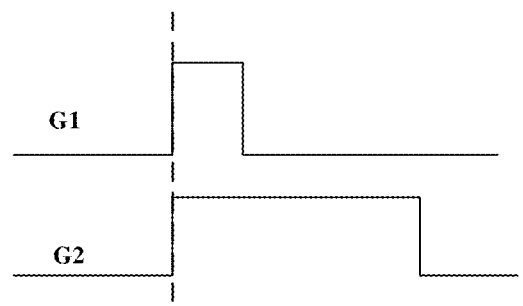

A working principle of the pixel circuit shown in FIG. 2B will be described below in conjunction with signal timing diagrams shown in FIG. 2D to FIG. 2F, wherein, FIG. 2D shows a signal timing diagram of the pixel circuit in a display process, and FIG. 2E and FIG. 2F show signal timing diagrams of the pixel circuit in a detection process.

For example, as shown in FIG. 2D, a display process of each frame of image comprises a data writing and reset stage 1 and a light emitting stage 2. FIG. 2C shows timing waveforms of respective signals in each stage. A working process of the 3T1C pixel circuit comprises: in the data writing and reset stage 1, the first control signal G1 and the second control signal G2 are both ON signals, the second transistor T2 and the third transistor T3 are turned on, the data signal DT is transmitted to the gate electrode of the first transistor T1 through the second transistor T2, a first switch K1 is closed, and the analog-to-digital converter writes a reset signal to the first electrode (e.g., an anode of the OLED) of the light-emitting element through the detection line 230 and the third transistor T3, the first transistor T1 is turned on and generates a driving current to charge the first electrode of the light-emitting element to a working voltage; in a light-emitting stage 2, the first control signal G1 and the second control signal G2 are both OFF signals, due to a bootstrap effect of the storage capacitor Cst, a voltage across both ends of the storage capacitor Cst remains unchanged, the first transistor T1 works in a saturated state with a current remaining unchanged, and drives the light-emitting element to emit light.

For example, FIG. 2E shows a signal timing diagram of the pixel circuit when detecting a threshold voltage. A working process of the 3T1C pixel circuit comprises: the first control signal G1 and the second control signal G2 are both ON signals, the second transistor T2 and the third transistor T3 are turned on, and the data signal DT is transmitted to the gate electrode of the first transistor T1 through the second transistor T2; the first switch K1 is closed, the analog-to-digital converter writes a reset signal to the first electrode (a node S) of the light-emitting element through the detection line 230 and the third transistor T3, the first transistor T1 is turned on and charge the node S until the first transistor is turned off, and the digital-to-analog converter samples a voltage on the detection line 230 to obtain the threshold voltage of the first transistor T1. The process may be performed when a display apparatus is turned off, for example.

For example, FIG. 2F shows a signal timing diagram of the pixel circuit when detecting carrier mobility. A working process of the 3T1C pixel circuit comprises: in a first stage, the first control signal G1 and the second control signal G2 are both ON signals, the second transistor T2 and the third transistor T3 are turned on, the data signal DT is transmitted to the gate electrode of the first transistor T1 through the second transistor T2; the first switch K1 is closed, and the analog-to-digital converter writes a reset signal to the first electrode (the node S) of the light-emitting element through the detection line 230 and the third transistor T3; in a second stage, the first control signal G1 is an OFF signal, the second control signal G1 is an ON signal, the second transistor T2 is turned off, the third transistor T3 is turned on, the first switch K1 and the second switch K2 are disconnected to make the detection line 230 float; due to a bootstrap effect of the storage capacitor Cst, a voltage across both ends of the storage capacitor Cst remains unchanged, the first transistor T1 works in a saturated state with a current remaining unchanged and drives the light-emitting element to emit light, then the digital-to-analog converter samples a voltage on the detection line 230, and in combination with a magnitude and duration of a light-emitting current, may calculate carrier mobility in the first transistor T1. For example, the process may be performed in a blanking stage between display stages.

Through the above-described detection, the electrical characteristics of the first transistor T1 may be obtained and a corresponding compensation algorithm may be implemented.

For example, as shown in FIG. 2A, the display substrate 10 may further comprise a data driving circuit 23 and a scan driving circuit 24. The data driving circuit 23 is configured to emit a data signal, for example, the above-described data signal DT, as required (e.g., inputting an image signal to the display apparatus); a pixel circuit of each sub-pixel is also configured to receive the data signal and apply the data signal to the gate electrode of the first transistor. The scan driving circuit 24 is configured to output various scan signals, for example, comprising the above-described first control signal G1 and second control signal G2, which is, for example, an Integrated Circuit (IC) chip or a Gate On Array (GOA) directly prepared on a display substrate.

For example, the display substrate 10 further comprises a control circuit 22. For example, the control circuit 22 is configured to control the data driving circuit 23 to apply a data signal, and control a gate driving circuit to apply a scan signal. An example of the control circuit 22 is a Timing Control (T-con) circuit. The control circuit 22 may be in various forms, for example, it may comprise a processor 121 and a memory 127; the memory 121 comprises an executable code, and the processor 121 executes the executable code to execute the above-described detecting method.

For example, the processor 121 may be a central processing unit (CPU) or other form of processing apparatus with data processing capability and/or instruction execution capability, and may comprise, for example, a microprocessor, a programmable logic controller (PLC), etc.

For example, the memory 127 may comprise one or more computer program products, and the computer program products may comprise various forms of computer readable storage media, for example, for example, a volatile memory and/or a non-volatile memory. The volatile memory may comprise, for example, a Random Access Memory (RAM) and/or a cache, or the like. The non-volatile memory may comprise, for example, a Read Only Memory (ROM), a hard disk, a flash memory, or the like. One or more computer program instructions may be stored on the computer readable storage medium, and the processor 121 may run functions desired by the program instructions. Various application programs and various data may also be stored in the computer readable storage medium, for example, the electrical characteristic parameters obtained in the above-described detecting method.

Figure 3A:
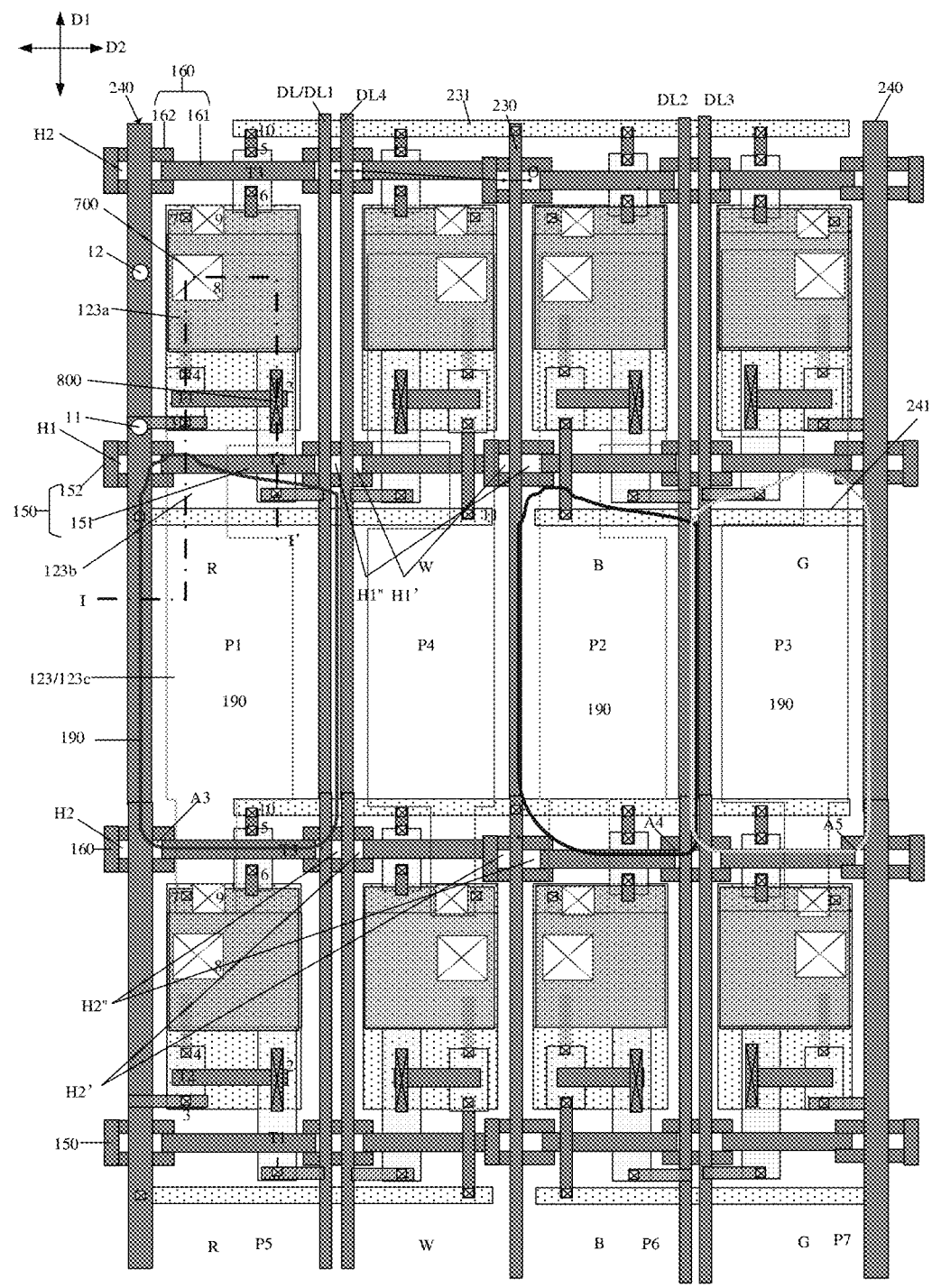
FIG. 3A is a schematic diagram IV of a display substrate provided by at least one embodiment of the present disclosure.

FIG. 3A is a schematic diagram of a sub-pixel of a display substrate 10 provided by at least one embodiment of the present disclosure; as shown in FIG. 3A, the display substrate 10 comprises a base substrate 101 on which a plurality of sub-pixels 100 are located. The plurality of sub-pixels 100 are distributed along a first direction D1 and a second direction D2 into a pixel array; the pixel array comprises a plurality of pixel columns and a plurality of pixel rows; a column direction of the pixel array is a first direction D1, a row direction is a second direction; and the first direction D1 and the second direction D2 intersect with each other, for example, are orthogonal to each other.

Figure 3B:
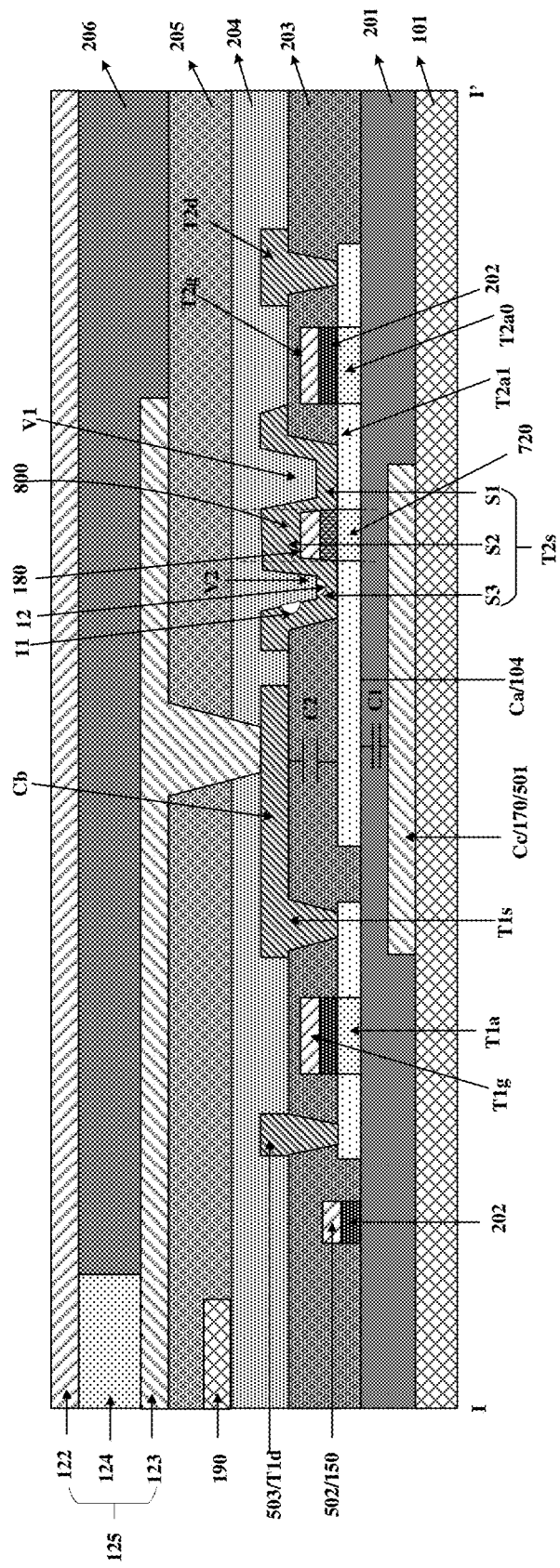
FIG. 3B is a cross sectional view along a cross section line I-I' of FIG. 3A.

For example, sub-pixels of each pixel row are divided into a plurality of pixel units; and each pixel unit is configured to emit full-color light. FIG. 3A exemplarily shows a pixel unit, and implementation of the present disclosure is not limited to the layout; FIG. 3B shows a cross sectional view along the cross section line I-I' of FIG. 3A. As shown in FIG. 3A, the pixel unit comprises a first sub-pixel P1, a second sub-pixel P2, and a third sub-pixel P3 that are sequentially arranged along the second direction D2; the first sub-pixel P1, the second sub-pixel P2, and the third sub-pixel P3 are respectively configured to emit light of three primary colors (RGB); for example, the first sub-pixel P1 is a red sub-pixel, the second sub-pixel P2 is a blue sub-pixel, and the third sub-pixel P3 is a green sub-pixel.

For example, the pixel unit may further comprise a fourth sub-pixel P4; and the fourth sub-pixel P4 is configured to emit white light. For example, the fourth sub-pixel P4 is located between the first sub-pixel P1 and the second sub-pixel P2; however, a position of the fourth sub-pixel P4 will not be limited in the embodiment of the present disclosure.

Referring to FIG. 3A and FIG. 3B in combination, the display substrate 10 comprises a first conductive layer 501, a first insulating layer 201, a semiconductor layer 104, a second insulating layer 202, a second conductive layer 502, a third insulating layer 203 and a third conductive layer 503 sequentially arranged on the base substrate 101.

A specific structure of the sub-pixels in the display substrate 10 shown in FIG. 3A will be described below. For convenience of description, in description below, T1$g$, T1$s$, T1$d$ and T1$a$ are used to respectively denote the gate electrode, the first electrode, the second electrode, and the active layer of the first transistor T1; T2$g$, T2$s$, T2$d$ and T2$a$ are used to respectively denote the gate electrode, the first electrode, the second electrode, and the active layer of the second transistor T2; T3$g$, T3$s$, T3$d$ and T3$a$ are used to respectively denote the gate electrode, the first electrode, the second electrode, and the active layer of the third transistor T3; Ca, Cb and Cc are used to respectively denote the first capacitor electrode, the second capacitor electrode, and the third capacitor electrode of the storage capacitor Cst.

It should be noted that, in the present disclosure, the so-called "arrangement in a same layer" refers to two (or more than two) structures deposited by a same deposition process and patterned by a same patterning process, and their materials may be the same or different. In the present disclosure, the "integral structure" refers to a structure formed of two (or more than two) structures that are connected with each other deposited by a same deposition process and patterned by a same patterning process, and their materials may be the same or different.

For example, referring to FIG. 3A and FIG. 3B in combination, the first conductive layer 501 comprises a shielding layer 170; an orthogonal projection of the shielding layer 170 on the base substrate 101 covers an orthogonal projection of the active layer T1$a$ of the first transistor T1 on the base substrate 101. The first transistor T1 serves as a drive transistor of the pixel circuit, and stability of its electrical characteristics is very important for light-emitting characteristics of the light-emitting element. The shielding layer 170 is an opaque layer, which may prevent light from entering the active layer of the first transistor T1 from a backside of the base substrate 101 and causing a threshold voltage of the first transistor T1 to drift, so as to avoid affecting light-emitting characteristics of a corresponding light-emitting element connected therewith.

For example, the shielding layer 170 is made of an opaque conductive material, for example, a metal or a metal alloy material. Such setting may relieve a back channel phenomenon of the base substrate 101 due to trapped charges.

For example, the semiconductor layer 104 comprises the active layer T1a of the first transistor T1, the active layer T2a of the second transistor T2, and the active layer T3a of the third transistor T3.

For example, the semiconductor layer 104 further comprises a first capacitor electrode Ca of the storage capacitor Cst, the first capacitor electrode Ca is obtained by performing a conducting treatment on the semiconductor layer 104; that is, the first capacitor electrode Ca is in the same layer as the active layer T1a of the first transistor T1, the active layer T2a of the second transistor and the active layer T3a of the third transistor.

For example, the second conductive layer 502 comprises the gate electrode T1g of the first transistor T1, the gate electrode T2g of the second transistor T2, and the gate electrode T3g of the third transistor T3.

For example, the display substrate 10 performs a conducting treatment (e.g., doping processing) on the semiconductor layer 104 by adopting a self-aligned process, with the second conductive layer 502 as a mask, so that a portion of the semiconductor layer 104 that is not covered by the second conductive layer 502 is conductive, so as to obtain the first capacitor electrode Ca, and portions of the active layers of the respective transistors that are located on both sides of the channel region are conductive to form a first electrode contact region and a second electrode contact region, respectively; the first electrode contact region and the second electrode contact region are respectively configured to be electrically connected with the first electrode and the second electrode of the transistor.

For example, the third conductive layer 503 comprises the first electrode T1s and the second electrode T1d of the first transistor T1, the first electrode T2s and the second electrode T2d of the second transistor T2, and the first electrode T3s and the second electrode T3d of the third transistor T3.

For example, the third conductive layer 503 further comprises the second capacitor electrode Cb of the storage capacitor Cst. For example, as shown in FIG. 3B, the second capacitor electrode Cb and the second electrode T1d of the first transistor T1 are arranged in a same layer and connected with each other as an integral structure. As shown in FIG. 3B, the first capacitor electrode Ca and the second capacitor electrode Cb overlap with each other in the direction perpendicular to the base substrate 101 to form the storage capacitor Cst.

FIG. 2C shows a pixel circuit diagram in a display substrate provided by another embodiment of the present disclosure. For example, the storage capacitor Cst further comprises a third capacitor electrode Cc; the third capacitor electrode is located on a side of the first capacitor electrode Ca that is away from the second capacitor electrode Cb and is electrically connected with the second capacitor electrode Cb through via hole No. 7 shown in FIG. 3A to form a structure of parallel capacitors, increasing a capacitance value of the storage capacitor Cst. For example, in the direction perpendicular to the base substrate 101, the third capacitor electrode Cc, the second capacitor electrode Cb, and the first capacitor electrode Ca all overlap with each other.

For example, as shown in FIG. 3B, the third capacitor electrode Cc is located on the first conductive layer 501. For example, the shielding layer 170 and the second capacitor electrode Cb of the storage capacitor Cst are provided in a same layer and made of a same material. For example, the shielding layer 170 and the second capacitor electrode Cb of the storage capacitor Cst are a same electrode block. In this case, the shielding layer 170 is coupled to the first electrode T3s of the third transistor T3 so as to prevent the shielding layer from causing electric potential changes during a display operation due to floating, thereby affecting a threshold voltage of the transistor.

For example, referring to FIG. 3A to FIG. 3B in combination, with respect to each sub-pixel, the first transistor T1 and the second transistor T2 are arranged along the second direction D2, and are arranged in parallel in the second direction D2. For example, in the first direction D1, the first transistor T1 and the second transistor T2 are located on a same side of the second capacitor electrode Cb, and the third transistor T3 is located on a side of the second capacitor electrode Cb that is opposite to the above side.

For example, the display substrate 10 further comprises an extension portion 180 protruding from the gate electrode T1g of the first transistor T1. The extension portion 180 extends from the gate electrode T1g of the first transistor T1 along the second direction D2 and at least partially overlaps with the first electrode T2s of the second transistor T2 in the direction perpendicular to the base substrate 101 and is electrically connected with the first electrode T2s of the second transistor T2.

As shown in FIG. 3B, the first electrode T2s of the second transistor T2 is electrically connected with a first electrode contact region Ta1 of the second transistor T2, the extension portion 180 (i.e., the gate electrode T1g of the first transistor T1) and the first capacitor electrode Ca through a via hole 800 (an example of the second via hole in the present disclosure). The first electrode T2s of the second transistor T2 is electrically connected with the three portions through one via hole, which, as compared with electrical connection with the three portions through multiple via holes respectively, may reduce occupied layout space, and increase wiring density, thereby increasing pixel density. As shown in FIG. 3B, the via hole 800 is formed in the third insulating layer 203; and the extension portion 180 and a portion of the second insulating layer 202 that is located below the extension portion 180 are located in the via hole 800 to space apart the via hole 800 into two groove portions, namely, a first groove V1 and a second groove V2; the second groove V2 is closer to the third transistor T3 than the first groove V1. The first electrode T2s of the second transistor T2 is filled in the via hole 800, covers the first groove V1 and the second groove V2, and has a surface parallel or inclined relative to the base substrate.

Referring to FIG. 3A to FIG. 3B in combination, the first electrode T2s of the second transistor T2 extends along the first direction D1, crosses over the extension portion 180 (intersects with the extension portion 180) and is electrically connected with the first capacitor electrode Ca through the via hole 800 (i.e., via hole No. 2 in FIG. 3A). For example, the extension portion 180 has a first side surface and a second side surface opposite in the first direction; for example, the via hole 800 extends along the first direction D1 and exposes the surface of the extension portion 180 and at least portions of the first side surface and the second side surface. The first electrode T2s of the second transistor T2 comprises a first portion S1, a second portion S2, and a third portion S3; and the first portion S1, the second portion S2, and the third portion S3 are sequentially connected in the first direction D1. The second portion S2 overlaps with the extension portion 180; the first portion S1 and the third portion S3 are respectively located on both sides of the second portion S2 in the first direction D1; the third portion S3 is located on a side of the second portion S2 that is close to the third transistor T3; the first portion S1 fills the first groove V1; and the third portion S3 fills the second groove V2. For example, through the via hole 800, the first portion S1 is electrically connected with the first electrode contact region T2*a*1 of the active layer T2*a* of the second transistor T2; and the second portion S2 is electrically connected with the extension portion 180 by direct contact, which helps increase a contact area and reduce resistance; and the third portion S3 is electrically connected with the first capacitor electrode Ca.

For example, the first electrode T2*s* of the second transistor T2 extends along the first direction, cladding the two side surfaces of the extension portion 180 through the via hole 800, for example, the first portion S1 covers the first side surface, and the third portion S3 covers the second side surface. In this way, the first electrode T2*s* of the second transistor T2 and the extension portion 180 have a greater contact area, thereby reducing contact resistance between the first electrode T2*s* of the second transistor T2 and the extension portion 180.

For example, as shown in FIG. 3B, the display substrate 10 may further comprise a connection portion 720; the connection portion 720 overlaps with the extension portion 180 in the direction perpendicular to the base substrate 101 and is located in the same layer as the first capacitor electrode Ca; and the connection portion 720 connects the first capacitor electrode Ca and the first electrode contact region T2*a*1 of the second transistor T2 into an integral structure. The connection portion 720 is a portion that is not conductorized as it is shielded by the extension portion 180. In the case where the second transistor T2 is turned on to transmit the data signal from the second electrode T2*d* of the second transistor T2 to the first electrode T2*s* of the second transistor T2 and the gate electrode T1*g* of the first transistor T1, the connection portion 720 is turned on under an action of the data signal in the extension portion 180 and the first electrode T2*s* of the second transistor T2 above the extension portion 180, so that the first electrode T2*s* of the second transistor T2 may be electrically connected with the first capacitor electrode Ca. In this way, a dual-channel structure is formed between the first electrode T2*s* of the second transistor T2 and the first capacitor electrode Ca, which helps reduce channel resistance.

In addition, as shown in FIG. 3B, the connection portion 720 connects the first capacitor electrode Ca and the first electrode contact region T2*a*1 of the second transistor T2 into an integral structure, thereby also including the first electrode contact region T2*a*1 of the second transistor T2 into the coverage of the first capacitor electrode Ca. In this way, the first capacitor electrode Ca may have a greater area and have a greater overlap area with the third capacitor electrode Cc, thereby increasing a capacitance value of the storage capacitor Cst.

For example, as shown in FIG. 3B, the third capacitor electrode Cc may at least partially overlap with the first electrode contact region T2*a*1 of the second transistor T2 in the direction perpendicular to the base substrate, so as to have a greater overlap area with the first capacitor electrode, to increase a capacitance value of the storage capacitor Cst. For example, the third capacitor electrode Cc and a channel region T2*a*0 of the second transistor T2 do not overlap with each other in the direction perpendicular to the base substrate 101. This is to prevent electric potential on the third capacitor electrode Cc from adversely affecting operation of the second transistor T2, for example, to prevent electric potential on the third capacitor electrode Cc from acting on the channel region T2*a*0 of the second transistor T2, which leads to problems that the second transistor T2 cannot be turned off normally, and a leakage current is relatively large, etc.

For example, as shown in FIG. 3A, the display substrate 10 may further comprise a first scan line 150 and a second scan line 160 correspondingly connected with each pixel row. For example, the first scan line 150 and the second scan line 160 are located in the second conductive layer 502 and extend along the second direction D2.

For example, the first scan line 150 is integrated with gate electrodes T2*g* of second transistors T2 of a corresponding row of sub-pixels as an integral structure; and the second scan line 160 is respectively integrated with gate electrodes T3*g* of third transistors T3 of a corresponding row of sub-pixels as an integral structure.

For example, as shown in FIG. 3A, with respect to each row of sub-pixels, along the first direction D1, the first scan line 150 and second scan line 160 corresponding thereto are respectively located on both sides of first transistors T1 in the row of sub-pixels.

For example, each first scan line 150 comprises first portions 151 and second portions 152 that are alternately connected; the second portion 152 is a ring structure; and in the first direction D1, a size of the second portion 152 is greater than that of the first portion 151. Similarly, each second scan line 160 comprises first portions 161 and second portions 162 that are alternately connected; the second portion 162 is a ring structure; and in the first direction D1, a size of the second portion 162 is greater than that of the first portion 161.

For example, the display substrate comprises a plurality of first surface microstructures and a plurality of second surface microstructures; and some of the plurality of first surface microstructures and the plurality of second surface microstructures overlap with the first portion of the first scan line in the direction perpendicular to the base substrate; and the others of the plurality of first surface microstructures and the plurality of second surface microstructures overlap with the second portion of the first scan line in the direction perpendicular to the base substrate; in the direction perpendicular to the base substrate, distribution density of the first surface microstructures and the second surface microstructures overlapping with the second portion of the first scan line is greater than distribution density of the first surface microstructures and the second surface microstructures overlapping with the first portion of the first scan line.

Since stress of the second portion with a ring structure is more concentrated than stress of the first portion with a strip structure, the above-described arrangement may improve a stress relief effect.

For example, the first overlap area is greater than an area of an orthogonal projection of each of the plurality of first surface microstructures or second surface microstructures on the base substrate; the second overlap area is greater than an area of an orthogonal projection of each of the plurality of first surface microstructures or second surface microstructures on the base substrate.

If an area of a release structure is too large, stress is likely to be over-released, leading to panel defects; in the case where the area of the surface microstructure is less than the overlap area, stress in the region may be fully released to ensure stability of the panel in the region.

It should be noted that, distribution density of surface microstructures in the present disclosure refers to the number of surface microstructures distributed in a unit area of the substrate.

For example, the display substrate 10 further comprises a plurality of signal lines extended along the first direction D1. For example, the signal lines may be data lines, power lines, auxiliary electrode lines, etc. As shown in FIG. 3A, each second portion 152 intersects with at least one data line in the direction perpendicular to the base substrate 101, thereby defining a plurality of first hollow regions H1 arranged along the second direction D2; each second portion 162 intersects with at least one data line in the direction perpendicular to the base substrate 101, thereby defining a plurality of second hollow regions H2 arranged along the second direction D2.

By setting the portion, which intersects with the signal line, of the scan line to be in a ring structure, that is, a dual-channel structure, yield of the device may be effectively improved. For example, a position where the signal lines intersect with each other is likely to cause a short circuit defect by electrostatic breakdown due to parasitic capacitance; during a detection process, in the case where one channel of the ring structure is detected to have a short circuit defect, the channel may be cut off (e.g., by laser cutting), and the circuit structure may still work normally through the other channel.

For example, as shown in FIG. 3A, the plurality of signal lines comprise a plurality of data lines DL; and the plurality of data lines DL are connected in one-to-one correspondence with each column of sub-pixels in the sub-pixel array to supply data signals to the sub-pixels. With respect to a pixel row, the plurality of data lines are divided into a plurality of data line groups in one-to-one correspondence with a plurality of pixel units in the pixel row, as shown in FIG. 3A, each data line group comprises a first data line DL1 connected with the first sub-pixel P1, a second data line DL2 connected with the second sub-pixel P2, a third data line DL3 connected with the third sub-pixel P3, and a fourth data line DL4 connected with the fourth sub-pixel P4. With respect to each pixel unit, the data lines DL1 to DL4 in corresponding connection with the pixel unit are all located between the first sub-pixel P1 and the third sub-pixel P3. Such arrangement may provide space for mounting detection lines and power lines.

For example, as shown in FIG. 3A, the display substrate 10 further comprises a plurality of detection lines 230 extended along the first direction D1; and the detection lines 230 are configured to be connected with a detection sub-circuit (e.g., the third transistor T3) in the sub-pixel 100, and to couple the detection sub-circuit to an external detection circuit. For example, at least one column of sub-pixels is provided between each detection line 230 and any one of the plurality of data lines DL; that is, the detection line 230 is not directly adjacent to any data line DL. For example, as shown in FIG. 3A, with respect to each pixel unit, the first data line DL1 and the fourth data line DL4 are located between the first sub-pixel P1 and the fourth sub-pixel P4; the second data line DL2 and the third data line DL3 are located between the second sub-pixel P2 and the third sub-pixel P3; and the detection line 230 is located between the fourth sub-pixel P4 and the second sub-pixel P2.

Such arrangement prevents the data line from being directly adjacent to the detection line to cause a resistance-capacitance load which leads to signal delay on the data line, and further avoids display non-uniformity caused by the delay. In addition, since a signal transmitted on the data line DL is usually a high-frequency signal, setting the detection line 230 and the data line DL not to be directly adjacent to each other may prevent the detection line 230 from receiving high-frequency signal crosstalk during an external compensation charging sampling process, which affects sampling accuracy.

For example, as shown in FIG. 3A, four sub-pixels in the pixel unit share one detection line 230; and the detection line 230 is respectively electrically connected with second electrodes T3$d$ of third transistors T3 in the four sub-pixels through a detection portion 231 extended in the second direction D2. The detection line 230 is electrically connected with the detection portion 231 through a via hole; and the detection portion 231 is electrically connected with the second electrode T3$d$ of the third transistor T3 through via hole No. 10. The first electrode T3$s$ of the third transistor T3 is electrically connected with the first electrode contact region T3$a$1 of the third transistor T3 through via hole No. 6; and the second electrode T3$d$ of the third transistor T3 is electrically connected with the second electrode contact region T3$a$2 of the third transistor T3 through via hole No. 5.

For example, the third transistor T3 and the second capacitor electrode Cb are arranged in a same layer and connected as an integral structure.

For example, as shown in FIG. 3A, the display substrate 10 further comprises a plurality of power lines 240 extended along the first direction D1; the plurality of power lines 240 are configured to supply a first power supply voltage to a plurality of sub-pixels; and the power supply voltage is, for example, high power supply voltage VDD. The power line 240, for example, is located in the third conductive layer 503. As shown in FIG. 3A, there is at least one pixel column between each of the plurality of power lines 240 and any one of the plurality of data lines; that is, the power line 240 is not directly adjacent to any data line DL. Such arrangement prevents the data line from being directly adjacent to the power line to cause a resistance-capacitance load which leads to signal delay on the data line, and further avoids defects such as color shift and display non-uniformity caused by the delay.

For example, any one power line 240 does not overlap with the detection portion 231 in the direction perpendicular to the base substrate 101, that is, the power line 240 is provided at an interval corresponding to adjacent detection portions 231. Such arrangement reduces overlap of signal lines, thereby effectively reducing parasitic capacitance between the signal lines and signal delay caused thereby.

For example, as shown in FIG. 3B, the power line 240 is electrically connected with a second electrode T1$d$ of a first transistor T1 of a directly adjacent sub-pixel (e.g., the first sub-pixel P1) through via hole No. 3, for example, the power line and the second electrode T1$d$ of the first transistor T1 are in an integral structure. For example, the power line 240 is electrically connected with a second electrode T1$d$ of a first transistor T1 of a sub-pixel not directly adjacent to the power line 240 through a connection electrode 241. For example, the connection electrode 241 is electrically connected with the second electrode T1$d$ of the first transistor T1 of the second sub-pixel or the fourth sub-pixel through via hole No. 11.

For example, the display substrate comprises a plurality of first surface microstructures 11 and a plurality of second surface microstructures 12; some of the plurality of first surface microstructures and the plurality of second surface microstructures are distributed on the plurality of data lines DL, the others of the plurality of first surface microstructures and the plurality of second surface microstructures are distributed on the plurality of power lines; distribution density of the plurality of first surface microstructures and the plurality of second surface microstructures on the plurality of data lines is greater than distribution density of the plurality of first surface microstructures and the plurality of second surface microstructures on the plurality of power lines.

Because the data line, which is applied with a dynamic voltage, is more sensitive to stress, setting distribution density of the surface microstructures on the data lines higher helps improve stability of the panel.

For example, the connection electrode 241 and the detection portion 231 are both located in the first conductive layer 501.

For example, in the direction perpendicular to the base substrate, the connection electrode 241 and the detection line 230 do not overlap with each other. As shown in FIG. 3B, the connection electrode 241 is disconnected in a position corresponding to the detection line 230 so as not to overlap with the detection line 230, which may reduce parasitic capacitance.

For example, the first surface microstructures and the second surface microstructures in the present disclosure may be provided in any signal line or any conductive structure in the above-described display substrate provided by the present disclosure, for example, may have some set at the via hole corresponding to the signal line or the conductive structure, to help release stress of the signal line or the conductive structure at the via hole, thereby reducing a risk of disconnection.

For example, a distance between the first surface microstructure and the second surface microstructure is less than 1/10 of a size of one sub-pixel. Such setting may effectively relieve stress within a pixel size range.

For example, components of a center distance between the orthogonal projection of the first surface microstructure on the base substrate and the orthogonal projection of the second surface microstructure on the base substrate in the first direction and in the second direction are respectively less than average sizes of each of the plurality of sub-pixels in the first direction and the second direction.

For example, a size of a sub-pixel is defined by signal lines directly adjacent thereto and respectively located on both sides. For example, as shown in FIG. 3B, an average size (length) of each sub-pixel in the first direction is an average separation distance between a first scan line 150 and a second scan line 160 corresponding thereto; and an average size (width) of each sub-pixel in the second direction is an average separation distance between a data line DL and a detection line 230/power line 240 corresponding thereto.

For example, a length and a width of a sub-pixel are respectively 100 microns to 500 microns, and the center distance between the orthogonal projections of the first surface microstructure 11 and the second surface microstructure 12 on the base substrate is 5 microns to 20 microns.

For example, the first surface microstructure 11 and the second surface microstructure 12 are arranged along the first direction D1, for example, located on signal lines (e.g., data lines, power lines, detection lines, etc.) extended along the first direction D1. For example, as shown in FIG. 3A, the first surface microstructure 11 and the second surface microstructure 12 are located on a same power line 240; the first surface microstructure 11 comprises a first concave structure; the second surface microstructure 12 comprises a second concave structure; the first concave structure and the second concave structure face sub-pixels of a same color, for example, included angles between orthogonal projections of normals of the first concave structure and the second concave structure on the base substrate and the first direction D1 are both acute included angles, that is, the first concave structure and the second concave structure point to a same column of sub-pixels.

For example, sub-pixels of each pixel column (i.e., sub-pixels located in a same column) emit light of a same color. When light emitted by the light-emitting element obliquely enters the concave structure, the concave structure may emit the light back to the light-emitting element (e.g., the cathode of light-emitting element); and the above-described arrangement may enable the concave structure to reflex light back to sub-pixels of a same color as the light, so as to avoid light crosstalk of sub-pixels with different extension directions.

Hereinafter, the display substrate provided by the present disclosure will be exemplarily described by taking the first electrode T2s of the second transistor T2 as the first conductive structure of the present disclosure; however, the embodiment of the present disclosure is not limited thereto.

For example, the first surface microstructure 11 is located on a surface of the first electrode T2s of the second transistor T2 that is inclined relative to the base substrate, for example, located on at least one of the first portion, the second portion, and the third portion of the first electrode T2s of the second transistor T2; the second surface microstructure 12 is located on a surface of the first electrode T2s of the second transistor T2 that is parallel to the base substrate, for example, located on at least one of the first portion, the second portion, and the third portion of the second electrode T2 of the second transistor T2.

For example, as shown in FIG. 3A to FIG. 3B, the first surface microstructure 11 is located at the third portion S3 of the first electrode T2s of the second transistor T2; the third portion S3 has two inclined surfaces (an example of the first surface of the first conductive structure of the present disclosure) relative to the base substrate due to being filled into the via hole 800 (or the second groove V2); and the first surface microstructure 11 is located on at least one of the two inclined surfaces. For example, as shown in FIG. 3B, the first surface microstructure 11 is located on an inclined surface close to the third transistor T3.

For example, in some other examples, the first surface microstructure 11 may be located at the first portion S1 of the second electrode T2 of the second transistor T2; the first portion S1 has an inclined surface (an example of the first surface of the first conductive structure of the present disclosure) relative to the base substrate due to being filled into the via hole 800; and the first surface microstructure 11 is located on the inclined surface.

For example, as shown in FIG. 3B, the second surface microstructure is located on a portion of a surface parallel to the surface of the base substrate that is formed as the third portion S3 is filled into the second groove. Since the conductive structure is subjected to greater stress in the groove, providing a surface microstructure in the portion of the third portion S3 that is filled into the groove may help relieve stress.

In other examples, the second surface microstructure 12 is respectively provided on surfaces of the first portion S1, the second portion S2, and the third portion S3 of the second electrode T2 of the second transistor T2 that are parallel to the surface of the base substrate (several examples of the second surface of the first conductive structure of the present disclosure). For example, the first portion S1 of the second electrode T2 of the second transistor T2 comprises a portion located in the via hole 800 and in direct contact with the semiconductor layer 104, and the second surface microstructure 12 may be provided on an upper surface of the portion to relieve stress.

It should be noted that, for ease of illustration, the concave structures of the first surface microstructure 11 and the second surface microstructure 12 are shown with blank in FIG. 3B; but in an actual structure, the concave structure may be at least filled by a surrounding insulating layer, for example, completely filled by the fourth insulating layer 204.

Due to a relatively large size of the via hole 800, arranging the first surface microstructure 11 and the second surface microstructure 12 on the second electrode T2s of the second transistor T2 may effectively relieve stress on the second electrode T2s of the second transistor T2, thereby reducing a risk of defects.

For example, a size of the first surface microstructure in the first direction is less than one-tenth of a maximum size of the third portion S3 in the first direction.

For example, a size of the first surface microstructure 11 or the second surface microstructure 12 in the first direction D1 (i.e., a size along the cross section line I-I' in FIG. 3B) is less than one-tenth of a maximum size of an orthogonal projection of the via hole 800 on the base substrate 101 in the first direction D1, for example, 2% to 5%.

For example, referring to FIG. 3A to FIG. 3B, each sub-pixel further comprises a light-emitting element 125, for example, the light-emitting element is an organic light-emitting diode, and comprises a first electrode 123, a light-emitting layer 124, and a second electrode 122 stacked in sequence. For example, the light-emitting element 125 has a top emission structure; the first electrode is reflective; and the second electrode 122 is transmissive or semi-transmissive. For example, the first electrode is a high work function material to act as an anode, for example, it is an ITO/Ag/ITO laminated structure; and the second electrode 122 is a low work function material to act as a cathode, for example, a semi-transmissive metal or metal alloy material, for example, an Ag/Mg alloy material.

For example, the display substrate 10 further comprises a fourth insulating layer 204 and a fifth insulating layer 205 located between the third conductive layer 503 and the first electrode 123 of light-emitting element. For example, the fourth insulating layer 204 is a passivation layer, for example, an inorganic insulating layer made of, for example, oxides of silicon such as silicon oxide, silicon nitride, and silicon oxynitride, nitrides of silicon, or nitrogen oxides of silicon; the fifth insulating layer 205 is made of an organic insulating material, for example, an organic insulating material such as polyimide (PI), acrylate, epoxy resin, and polymethyl methacrylate (PMMA). For example, the fifth insulating layer 205 is a planarization layer.

For example, the display substrate 10 further comprises a pixel defining layer 206 located on the first electrode 123 of the light-emitting element 125; and the pixel defining layer 206 is made of an organic insulating material, for example, an organic insulating material such as polyimide (PI), acrylate, epoxy resin, and polymethyl methacrylate (PMMA). The first electrode 123 of the light-emitting element 125 is electrically connected with the first electrode T1s of the first transistor T1 and the second capacitor electrode Cb through a via hole 700 (i.e., via hole No. 8 in FIG. 3A); and the via hole 700, for example, runs through the fourth insulating layer 204 and the fifth insulating layer 205.

For example, as shown in FIG. 3A to FIG. 3B, the first electrode 123 of the light-emitting element comprises a first electrode portion 123a, a second electrode portion 123b, and a third electrode portion 123c that are sequentially connected in the first direction D1; the first electrode portion 123a is configured to be electrically connected with a first electrode T1s of a corresponding first transistor T1 and overlaps with the first electrode T1s of the corresponding first transistor T1 in the direction perpendicular to the base substrate 101. The third electrode portion 123c is configured to be in direct contact with the light-emitting layer 124, and overlap with an opening region (not shown) of the light-emitting element in the direction perpendicular to the base substrate, that is, the third electrode portion 123c corresponds to an effective light-emitting region of the light-emitting element; the third electrode portion 123c does not overlap with the via hole 700 in the direction perpendicular to the base substrate, which prevents an interface at the via hole 700 from adversely affecting luminous efficiency of a light-emitting material. The second electrode portion 123b connects the first electrode portion 123a and the third electrode portion 123c. For example, the opening region of the light-emitting element is an opening region in the pixel defining layer 206 that corresponds to the light-emitting element, and the opening region exposes the first electrode 123 of light-emitting element and accommodates at least a portion of the light-emitting layer of the light-emitting element.

As shown in FIG. 3A, an average size of the second electrode portion 123b of the first electrode 123 of the light-emitting element in the second direction D2 is less than an average size of the first electrode portion 123a in the second direction D2, and is also less than an average size of the third electrode portion 123c in the second direction D2.

For example, a sum of a maximum size of the first electrode portion along the first direction and a maximum size along the second direction is less than a sum of a maximum size of the third electrode portion along the first direction and a maximum size along the second direction; and a sum of a maximum size of the second electrode portion along the first direction and a maximum size along the second direction is less than the sum of the maximum size of the third electrode portion along the first direction and the maximum size along the second direction.

For example, the display substrate comprises a plurality of first surface microstructures 11 and a plurality of second surface microstructures 12; some of the plurality of first surface microstructures and the plurality of second surface microstructures overlap with the first electrode portion in the direction perpendicular to the base substrate, and the others of the plurality of first surface microstructures and the plurality of second surface microstructures overlap with the third electrode portion in the direction perpendicular to the base substrate; and distribution density of the first surface microstructures and the second surface microstructures overlapping with the first electrode portion is greater than distribution density of the first surface microstructures and the second surface microstructures overlapping with the third electrode portion.

Since the first electrode portion is close to a pixel driving region, for example, it at least partially overlaps with the first transistor T1 in the direction perpendicular to the base substrate, and stress in the pixel driving region is more concentrated, the above-described arrangement may effectively release stress in the driving region, and improve performance of the display substrate.

As shown in FIG. 3A, in the first direction D1, the first scan line 150 is located between the first electrode portion 123a and the third electrode portion 123c; the second electrode portion 123b overlaps with the first scan line 150 in the direction perpendicular to the base substrate; and reducing the size of the second electrode portion 123b in the second direction D2 helps reduce an overlap area between the second electrode portion 123b and the first scan line 150, thereby reducing parasitic capacitance.

For example, the second electrode portion 123b overlaps with the first portion 151 of the first scan line 150 in the direction perpendicular to the base substrate 101, and does not overlap with the second portion 152 of the first scan line 150 in the direction perpendicular to the base substrate 101.

Since the second portion 152 of the first scan line 150 overlaps with the signal line (e.g., the power line, the detection line, the data line, etc.) along the first direction D1, the second portion 152 is prone to defects such as short circuit, and needs to be repaired in a repairing process. Setting the first electrode of light-emitting element to not overlap with the second portion 152 of the first scan line 150 may reduce a difficulty in repairing at the second portion 152.

As shown in FIG. 3A, the first sub-pixel P1 has a first side and a second side opposite to each other in the second direction D2; the first side is provided with a power line 240; the second side is provided with a data line DL (a first data line DL1 and a fourth data line DL4); the second electrode portion 123b is concave toward the first side relative to the first electrode portion 123a and the third electrode portion 123c, that is, concave in a direction away from the second side; that is, the second electrode portion 123b is closer to the power line than to the data line.

Since a constant voltage is transmitted on the power line 240 and a high-frequency signal is transmitted on the data line DL, providing the second electrode portion 123b closer to the power line may prevent the high-frequency signal on the data line DL from affecting electric potential on the first electrode of the light-emitting element, thereby affecting a display gray scale.

There are similar settings with respect to the second sub-pixel, the third sub-pixel, and the fourth sub-pixel. For example, as shown in FIG. 3A, the second sub-pixel P2 is directly adjacent to the third sub-pixel P3; the third sub-pixel P3 has a first side and a second side opposite to each other in the second direction; the second data line DL2 and the third data line DL3 are located on the first side of the third sub-pixel P3 and located between the second sub-pixel P2 and the third sub-pixel P3; and the detection line 230 is located on the second side of the third sub-pixel P3. The second electrode portion of the first electrode of the light-emitting element of the third sub-pixel is concave relative to the first electrode portion and the third electrode portion thereof in a direction away from the second side of the third sub-pixel, that is, the second electrode portion is closer to the detection line 230 than to the data line.

Since a low-frequency detecting signal is transmitted on the detection line 230, and a high-frequency signal is transmitted on the data line DL, providing the second electrode portion closer to the detection line may prevent the high-frequency signal on the data line DL from affecting electric potential on the first electrode of the light-emitting element, thereby affecting a display gray scale.

For example, a light-emitting element OLED in each sub-pixel is configured to emit white light; the display substrate 10 further comprises a color filter layer; and white light transmits through the color filter layer to realize full-color display. For example, the light-emitting layer 124 may be formed on an entire surface by an Open Mask combined with an evaporation process, so as to avoid performing a patterning process on the light-emitting layer with a Fine Metal Mask (FMM), thereby preventing limited accuracy of the FMM from restricting resolution of the display substrate.

For example, the light-emitting element of the display substrate 10 provided by some embodiments of the present disclosure may adopt a bottom emission structure. For example, as shown in FIG. 3A to FIG. 3B, the color filter layer is located on a side of the first electrode of the light-emitting element that is close to the base substrate 101, for example, located between the fourth insulating layer 204 and the fifth insulating layer 205. The color filter layer comprises a plurality of color filter portions 190 respectively corresponding to a plurality of sub-pixels except for white sub-pixels, that is, the first sub-pixel P1, the second sub-pixel P2, and the third sub-pixel P3 respectively correspond to a color filter portion 190; light emitted by light-emitting elements of the first sub-pixel P1, the second sub-pixel P2, and the third sub-pixel P3 is emergent through the color filter portion 90 to form display light. Light of the white sub-pixel does not need to pass through the color filter layer, so the fourth sub-pixel P4 is not provided with a color filter portion correspondingly.

For example, adjacent color filter portions overlap with each other in the direction perpendicular to the base substrate; and the first surface microstructure or the second surface microstructure is provided corresponding to an overlap position. Due to stress non-uniformity caused by overlapping of the color filter portions, the surface microstructures may effectively release stress in the region.

For example, in the direction perpendicular to the base substrate, the color filter portion corresponding to the first sub-pixel, the color filter portion corresponding to the second sub-pixel, and the second surface microstructure overlap with each other in the direction perpendicular to the base substrate.

Referring to FIG. 3A to FIG. 3B in combination, each color filter portion 190 overlaps with a first electrode portion 123a of a first electrode of a light-emitting element of a corresponding sub-pixel, and does not overlap with a third electrode portion 123c of the first electrode of the light-emitting element; this is because the color filter layer only needs to be provided corresponding to a light-emitting layer of the light-emitting element. As shown in FIG. 3B, in the direction perpendicular to the base substrate, the third electrode portion 123c of the first electrode of the light-emitting element, the light-emitting layer 124, and the color filter portion 190 overlap with each other.

For example, as shown in FIG. 3A to FIG. 3B, in the direction perpendicular to the base substrate 101, a portion of the second electrode portion 123b of the first electrode of the light-emitting element of the first sub-pixel P1 that overlaps with the first scan line 150 also overlaps with the color filter portion 190 corresponding to the first sub-pixel P1. Since in the direction perpendicular to the base substrate, the color filter portion 190 is located between the first scan line 150 and the first electrode 123 of the light-emitting element, and since the fifth insulating layer 205 on the color filter portion 190 is a planarization layer, formation of the color filter portion 190 does not affect a height of the fifth insulating layer 205 at the color filter portion relative to the base substrate, that is, it does not change the distance between the first electrode of the light-emitting element and the first scan line 150; however, a dielectric constant of the color filter portion 190 is lower than a dielectric constant of the fifth insulating layer 205; therefore, forming the color filter portion 190 between the second electrode portion 123b and the first scan line 150 to overlap with the second electrode portion 123b and the first scan line 150 helps further reduce parasitic capacitance between the first electrode of the light-emitting element and the first scan line.

The inventor finds that, in the case where a plurality of first hollow regions H1 or second hollow regions H2 are regularly arranged along the second direction D2 to generate certain regular continuity, periodic diffraction phenomena occur, causing the hollow regions and positions of metal wires of non-hollow regions to have obvious differences in reflecting ambient light, resulting in display non-uniformity.

On the one hand, as shown in FIG. 3A, in a pixel unit, geometric centers of a plurality of first hollow regions H1 are not on a straight line, which helps reduce regularity of the first hollow regions arranged in a same direction and relieve display non-uniformity caused by periodic diffraction.

On the other hand, the display substrate provided by the embodiment of the present disclosure uses the color filter layer to selectively shield a plurality of hollow regions located in a same row and corresponding to one pixel unit, thereby breaking arrangement regularity of the hollow regions in the pixel unit and weakening a diffraction effect to improve display uniformity.

As shown in FIG. 3A, in the first direction D1, a color filter portion corresponding to one pixel row (the first pixel row) is located between a first scan line 150 corresponding to the pixel row and a second scan line 160 corresponding to a next pixel row (the second pixel row) directly adjacent thereto.

For example, the second pixel row comprises a fifth sub-pixel P5, a sixth sub-pixel P6, and a seventh sub-pixel P7 that are sequentially arranged along the second direction D2; the fifth sub-pixel P5 and the first sub-pixel P1 are located in a same column; the sixth sub-pixel P6 and the second sub-pixel P2 are located in a same column; and the seventh sub-pixel P7 and the third sub-pixel P3 are located in a same column. For example, sub-pixels located in a same column emit light of a same color.

For example, as shown in FIG. 3B, a first electrode of a light-emitting element of each sub-pixel also extends in the first direction D1 to overlap with a second capacitor electrode Cb of a sub-pixel in a next pixel row adjacent thereto in the direction perpendicular to the base substrate. In a normal state, there is a fourth insulating layer 204 and a fifth insulating layer 205 between the first electrode of the light-emitting element and the second capacitor electrode Cb of the sub-pixel of the next row; when a pixel circuit of the sub-pixel is defective, a repair hole may be formed between the first electrode of the light-emitting element and the second capacitor electrode Cb of the sub-pixel of the next row, for example, laser is used to remove the fourth insulating layer 204 and allow the first electrode of the light-emitting element to be filled into the repair hole and be electrically connected with the second capacitor electrode Cb of the sub-pixel of the next row; however, the second capacitor electrode Cb is electrically connected with the first electrode of the light-emitting element of the sub-pixel to which it belongs, so the first electrode of the light-emitting element of the defective sub-pixel forms electrical connection with a first electrode of a light-emitting element of the sub-pixel in the next row, so that the defective sub-pixel is repaired. FIG. 3A shows a position of the repair hole with via hole No. 9.

For example, color filter portions 190 corresponding to the first pixel row each have a side edge close to the second pixel row, for example, the side edge is linear and parallel to the second direction D2.

For example, in the direction perpendicular to the base substrate, a color filter portion 190 corresponding to the first sub-pixel P1 overlaps with at least one of the plurality of first hollow regions H; and a color filter portion 190 corresponding to the second sub-pixel P2 overlaps with none of the plurality of first hollow regions H1.

For example, in the direction perpendicular to the base substrate, the color filter portion corresponding to the first sub-pixel P1 overlaps with one of the plurality of first hollow regions H1 and has a first overlap area; the color filter portion corresponding to the second sub-pixel P2 overlaps with another of the plurality of first hollow regions H1 and has a second overlap area; and the first overlap area is different from the second overlap area.

For example, an absolute value of a difference between the first overlap area and the second overlap area is greater than $(n*\lambda)^2$ (i.e., a square of integer times of a wavelength), where, $\lambda$ is a greater value of wavelengths of light emitted by the first sub-pixel P1 and the second sub-pixel P2. The greater the absolute value of the difference between the first overlap area and the second overlap area, the smaller the influence of light diffraction on a display effect.

As shown in FIG. 3A, in the direction perpendicular to the base substrate, the color filter portion 190 corresponding to the first sub-pixel P1 overlaps with one of the plurality of first hollow regions H1; and the color filter portion corresponding to the second sub-pixel P2 and the color filter portion 190 corresponding to the third sub-pixel P3 190 overlaps with none of the plurality of first hollow regions H1.

As shown in FIG. 3A, the second portion 162 of the second scan line 160 corresponding to the second pixel row overlaps with the power line 240, the data line DL, and the detection line 230 in the direction perpendicular to the base substrate, to define a plurality of second hollow regions H2 arranged in sequence in the second direction D2.

As shown in FIG. 3A, in the direction perpendicular to the base substrate, the color filter portion corresponding to the first sub-pixel P1 overlaps with one second hollow region of the plurality of second hollow regions H2 with a third overlap area A3; the color filter portion corresponding to the second sub-pixel P2 overlaps with another second hollow region of the plurality of second hollow regions H2 with a fourth overlap area A4; the third sub-pixel P3 overlaps with still another second hollow region of the plurality of second hollow regions H2 with a fifth overlap area A5; and the third overlap area A3, the fourth overlap area A4, and the fifth overlap area A5 are all different from each other. For example, as shown in FIG. 3B, A3>A4>A5.

As shown in FIG. 3A, none of first hollow regions H1' close to the fourth sub-pixel P4 among the plurality of first hollow regions H1 overlaps with the color filter layer in the direction perpendicular to the base substrate; and none of second hollow regions H2' close to the fourth sub-pixel P4 among the plurality of second hollow regions H2 overlaps with the color filter layer in the direction perpendicular to the base substrate.

As shown in FIG. 3A, a first hollow region H1" directly adjacent to the first hollow region H1' in the second direction D2 does not overlap with the color filter layer in the direction perpendicular to the base substrate; and a second hollow region H2" directly adjacent to the second hollow region H2' in the second direction D2 does not overlap with the color filter layer in the direction perpendicular to the base substrate.

Since the fourth sub-pixel P4 emits white light, and diffraction of white light has less display uniformity, the hollow region close to the fourth sub-pixel P4 may not be shielded.

For example, as shown in FIG. 3B, in the direction perpendicular to the base substrate, the first data line DL1, the second data line DL2, and the third data line DL3 all overlap with the color filter layer. Such arrangement may prevent the data line from reflecting light to cause display non-uniformity.

For example, the fourth data line DL4 does not overlap with the color filter layer.

As shown in FIG. 3B, in the direction perpendicular to the base substrate, the detection line 230 overlaps with the color filter layer, and an overlap area thereof is less than an overlap area between any one data line of the first data line DL1, the second data line DL2, and the third data line DL3 and the color filter layer.

Since the fourth data line DL4 and the detection line 230 are closest to the fourth sub-pixel P4 among the first data line DL1, the second data line DL2, and the third data line DL3, the fourth sub-pixel P4 emits white light, and diffraction of white light has less influence on display uniformity, the fourth data line DL4 and the detection line 230 have less influence on reflection of light emitted by the first sub-pixel P4; and the fourth data line and the detection line may not be shielded.

Figure 3C:
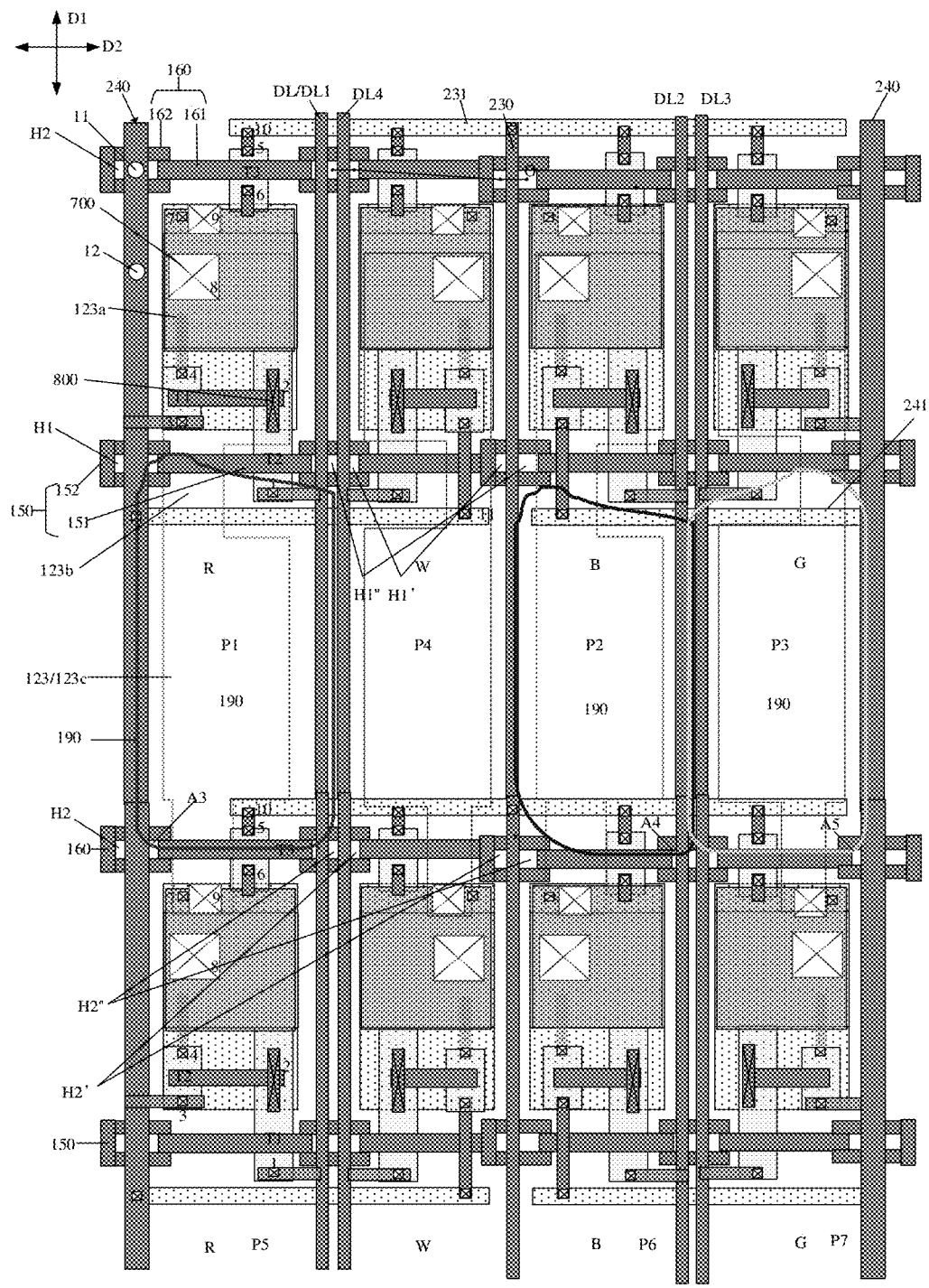
FIG. 3C to FIG. 3E are schematic diagrams of display substrates provided by other embodiments of the present disclosure.

In other examples, as shown in FIG. 3C, the first surface microstructure 11 and the second surface microstructure 12 are located on a same power line 240, that is, the power line 240 serves as the first conductive structure; and the first surface microstructure 11 at least partially overlaps with the second hollow region H2 corresponding to the power line 240 in the direction perpendicular to the base substrate.

Since the power line 240 has a slope at the second hollow region H2 and stress is relatively large, arranging the first surface microstructure 12 on a position of the power line 240 that corresponds to the second hollow region H2 helps relieve stress and improve yields.

Figure 3D:
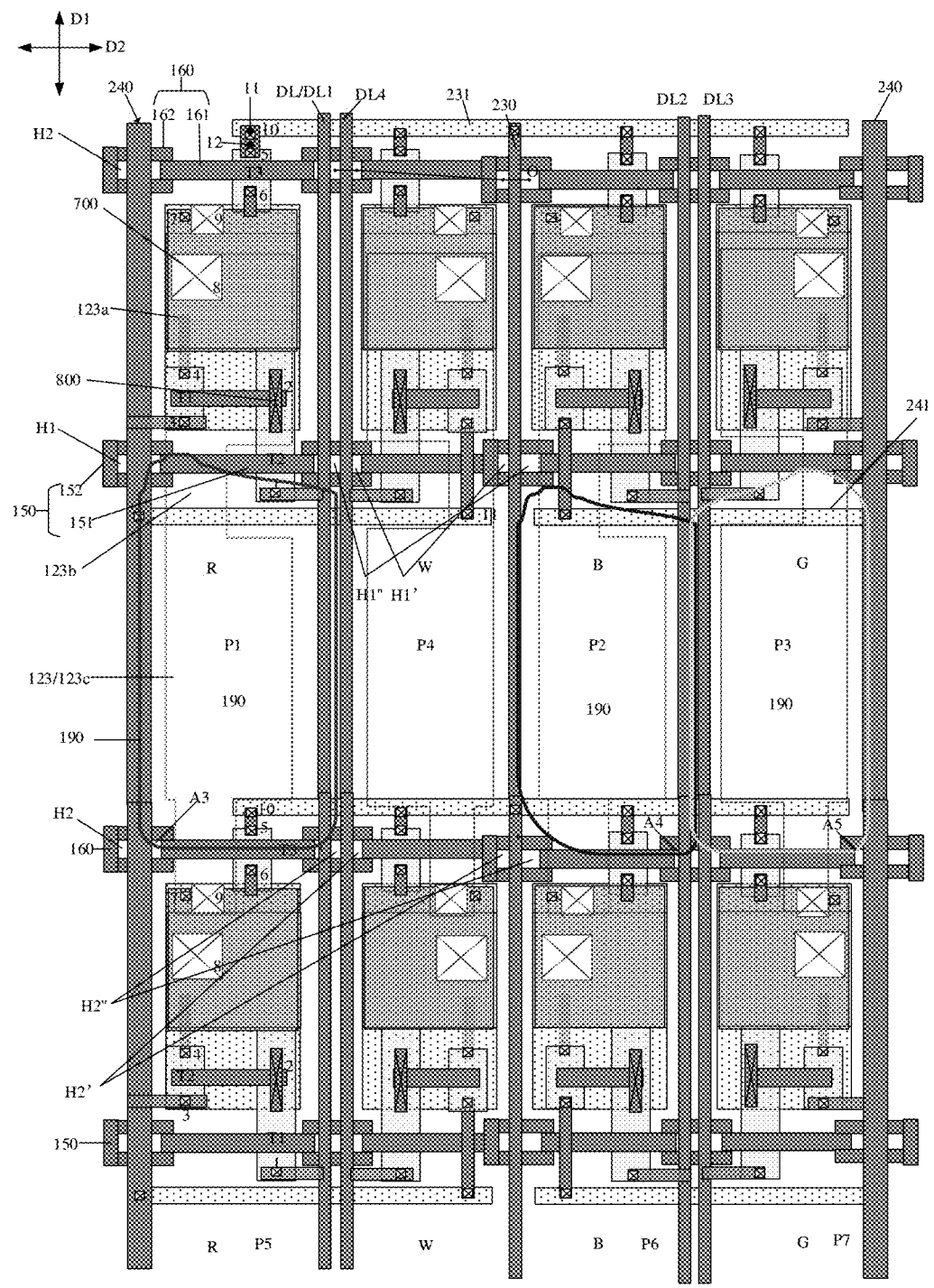

In still other examples, as shown in FIG. 3D, the first surface microstructure 11 and the second surface microstructure 12 are located on the second electrode T3$d$ of the third transistor T3, that is, the second electrode T3$d$ of the third transistor T3 serves as the first conductive structure; and the first surface microstructure at least partially overlaps with via hole No. 10 (an example of the fourth via hole in the present disclosure) in the direction perpendicular to the base substrate.

Figure 3E:
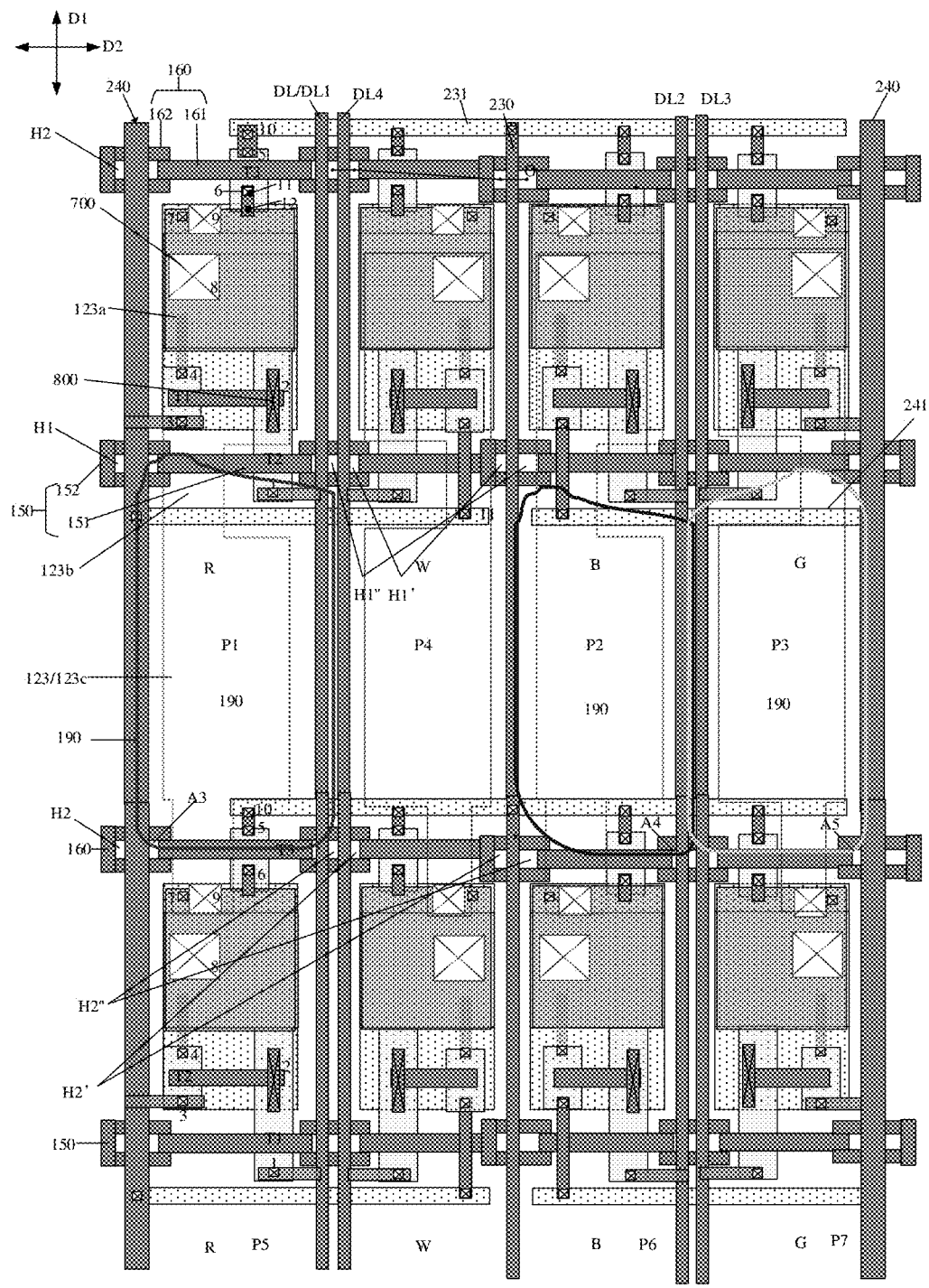

In still other examples, as shown in FIG. 3E, the first surface microstructure 11 and the second surface microstructure 12 are located on the first electrode T3$s$ of the third transistor T3, that is, the first electrode T3$s$ of the third transistor T3 serves as the first conductive structure; and the first surface microstructure at least partially overlaps with via hole No. 6 in the direction perpendicular to the base substrate.

For the sake of clarity, the first surface microstructure 11 and the second surface microstructure 12 are shown by black dots in both FIG. 3D and FIG. 3E. Since a conductive structure in a first position of the via hole has a greater slope, and stress is greater, arranging the first surface microstructure in a position of the first conductive structure that corresponds to the via hole may help release stress.

At least one embodiment of the present disclosure further provides a fabrication method of the above-described display substrate. The fabrication method of the display substrate provided by the embodiment of the present disclosure will be exemplarily described below in conjunction with FIG. 3A to FIG. 3B and FIG. 4A to FIG. 4D by taking a sub-pixel as an example; however, the embodiment of the present disclosure is not limited thereto. FIG. 4A to FIG. 4D respectively show patterns of a first conductive layer, a semiconductor layer, a second conductive layer, and a third conductive layer in one sub-pixel (e.g., the first sub-pixel P1).

The fabrication method comprises steps S61 to S65.

Figure 4A:
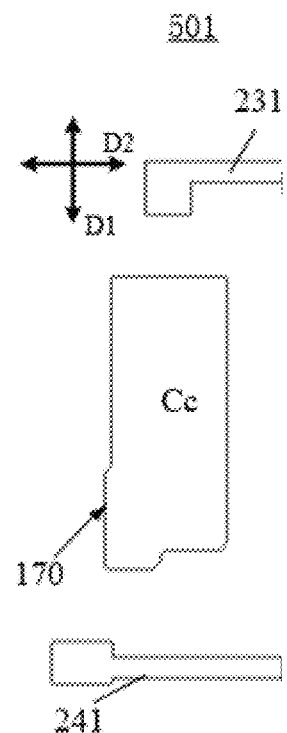
FIG. 4A is a schematic plan view of a first conductive layer in a display substrate provided by at least one embodiment of the present disclosure.

Step S61: forming a first conductive material layer, and performing a patterning process on the first conductive material layer to form a first conductive layer 501 as shown in FIG. 4A, that is, a light shielding layer 170 and a third capacitor electrode Cc of a storage capacitor Cst. The patterning process also forms a detection portion 231 and a connection electrode 241 that are insulated from each other.

Figure 4B:
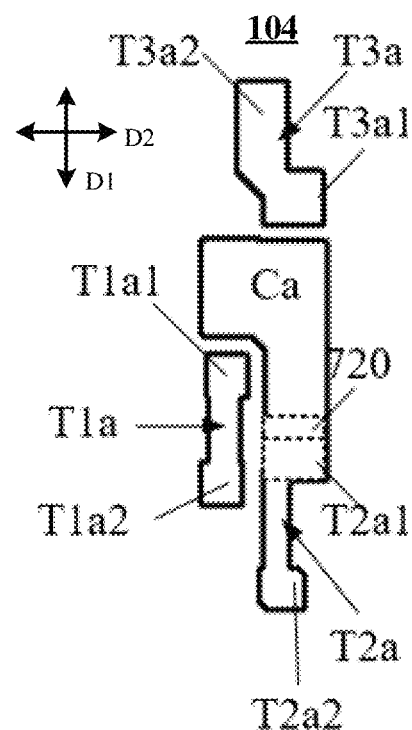
FIG. 4B is a schematic plan view of a semiconductor layer in a display substrate provided by at least one embodiment of the present disclosure.

Step S62: forming a first insulating layer 201 on the first conductive layer 501 and forming a semiconductor material layer on the first insulating layer, and performing a patterning process on the semiconductor material layer to form a semiconductor layer 104 as shown in FIG. 4B, that is, forming an active layer T1$a$ of a first transistor T1, an active layer T2$a$ of a second transistor T2, and an active layer T3$a$ of a third transistor T3 that are spaced apart from each other.

Figure 4C:
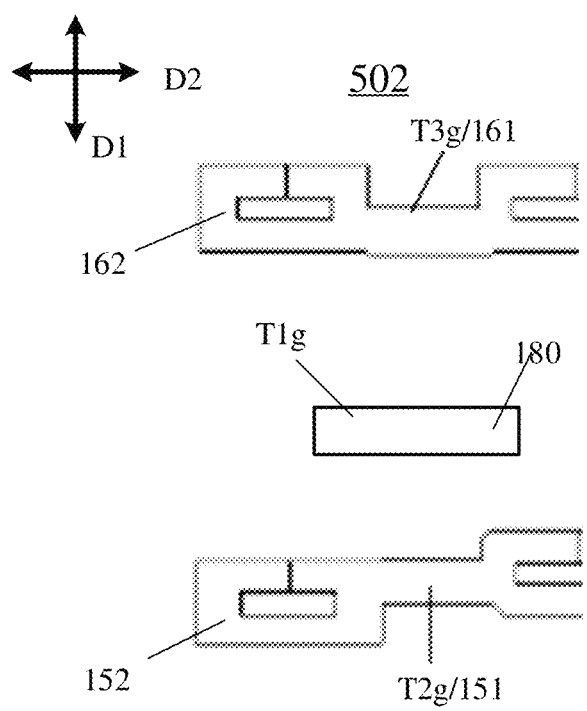
FIG. 4C is a schematic plan view of a second conductive layer in a display substrate provided by at least one embodiment of the present disclosure.

Step S63: forming a second insulating layer 202 on the semiconductor layer 104, forming a second conductive material layer on the second insulating layer, and performing a patterning process on the second conductive material layer to form a second conductive layer 502 as shown in FIG. 4C, that is, forming a gate electrode T1$g$ of the first transistor T1, a gate electrode T2$g$ of the second transistor T2, and a gate electrode T3$g$ of the third transistor T3 that are insulated from each other. FIG. 4C also shows an extension portion 180.

For example, as shown in FIG. 4C, the second conductive layer 502 further comprises a first scan line 150 and a second scan line 160 that are insulated from each other.

For example, a line width of the first scan line 150 and the second scan line 160 ranges from 5 microns to 15 microns.

For example, the first scan line 150 and gate electrodes T2$g$ of second transistors T2 of a corresponding row of sub-pixels are an integral structure; and the second scan line 160 is respectively integrated with gate electrodes T2$g$ of second transistors T2 of a corresponding row of sub-pixels as an integral structure.

Step S64: performing a conducting treatment (e.g., doping processing) on a semiconductor layer 204 by adopting a self-aligned process, with the second conductive layer 502 as a mask, so that a portion of the semiconductor layer 204 that is not covered by the second conductive layer 502 becomes conductive, so as to obtain the first capacitor electrode Ca, and to enable portions of the active layers of the respective transistors that are located on both sides of a channel region become conductive to form a first electrode contact region and a second electrode contact region, respectively; the first electrode contact region and the second electrode contact region are respectively configured to be electrically connected with the first electrode and the second electrode of the transistor. FIG. 4B shows a first electrode contact region T1$a$1 and a second electrode contact region T1$a$2 of the active layer T1$a$ of the first transistor T1, a first electrode contact region T2$a$1 and a second electrode contact region T2$a$2 of the active layer T2$a$ of the second transistor T2, and a first electrode contact region T3$a$1 and a second electrode contact region T3$a$2 of the active layer T3$a$ of the third transistor T3. FIG. 4B also shows a connection portion 720.

For example, the second insulating layer 202 is etched before performing conductorization on the semiconductor layer 104, so that a region of the second insulating layer 202 that is not covered by the second conductive layer 502 is completely etched, that is, the second insulating layer 202 coincides with the second conductive layer 502 in a direction perpendicular to the base substrate 101. In this way, when a region of the semiconductor layer 204 that is not covered by the second conductive layer 202 is conductorized by ion implantation, implanted ions may not be blocked by the second insulating layer 202.

Figures 4D, 5A:
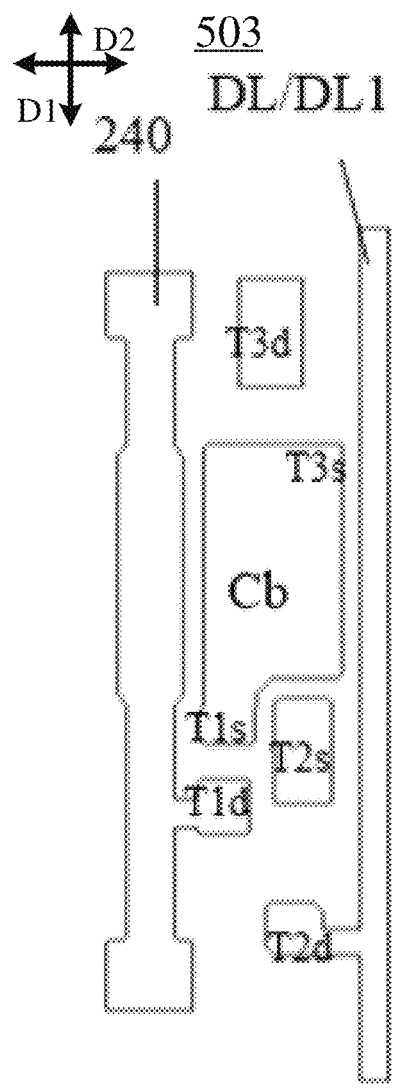
FIG. 4D is a schematic plan view of a third conductive layer in a display substrate provided by at least one embodiment of the present disclosure.
FIG. 5A is a schematic diagram I of a display panel provided by at least one embodiment of the present disclosure.

Step S65: forming a third insulating layer 203 on the second conductive layer 502, forming a third conductive material layer on the third insulating layer 203, and performing a patterning process on the third conductive material layer to form a third conductive layer 503 as shown in FIG. 4D, that is, forming a first electrode T1s and a second electrode T1d of the first transistor T1, a first electrode T2s and a second electrode T2d of the second transistor T2, and a first electrode T3s and a second electrode T3d of the third transistor T3.

For example, the third conductive layer 503 further comprises a data line DL, a detection line 230, and a power line 240 that are insulated from each other.

For example, a line width of the data line DL ranges from 5 microns to 15 microns; a line width of the detection line 230 ranges from 5 microns to 30 microns; and a line width of the power line 240 ranges from 5 microns to 30 microns.

For example, as shown in FIG. 4D, the power line 240 and the second electrode T1d of the first transistor T1 in a (closest) sub-pixel directly adjacent thereto are an integral structure. For example, each data line 110 and a second electrode T2d of a second transistor T2 in a sub-pixel connected therewith are an integral structure.

For example, a material of the semiconductor material layer comprises but is not limited to silicon-based materials (amorphous silicon (a-Si), polysilicon (p-Si), etc.), metal oxide semiconductors (IGZO, ZnO, AZO, IZTO, etc.) and organic materials (hexathiophene, polythiophene, etc.).

For example, the above-described first conductive material layer is a light-shielding conductive material, for example, gold (Au), silver (Ag), copper (Cu), aluminum (Al), molybdenum (Mo), magnesium (Mg), tungsten (W), and alloy materials composed of a combination of the above metals. For example, the first conductive material layer may be a molybdenum-titanium alloy, for example, with a thickness of 50 nanometers to 100 nanometers.

For example, materials of the second conductive material layer and the third conductive material layer may comprise gold (Au), silver (Ag), copper (Cu), aluminum (Al), molybdenum (Mo), magnesium (Mg), tungsten (W) and alloy materials composed of a combination of the above metals; or conductive metal oxide materials, for example, indium tin oxide (ITO), indium zinc oxide (IZO), zinc oxide (ZnO), zinc aluminum oxide (AZO), etc.

For example, the second conductive material layer is a laminated structure of a molybdenum-titanium alloy and copper, for example, a thickness of the molybdenum-titanium alloy is 30 nanometers to 50 nanometers, and the thickness of copper is 300 nanometers to 400 nanometers.

For example, the third conductive material layer is a laminated structure of molybdenum-titanium alloy and copper, for example, a thickness of the molybdenum-titanium alloy is 30 nanometers to 50 nanometers, and the thickness of copper is 400 nanometers to 700 nanometers.

For example, a material of the semiconductor material layer comprises but is not limited to silicon-based materials (amorphous silicon (a-Si), polysilicon (p-Si), etc.), metal oxide semiconductors (IGZO, ZnO, AZO, IZTO, etc.) and organic materials (hexathiophene, polythiophene, etc.).

For example, the semiconductor material layer is made of indium gallium zinc oxide, and has a thickness of 30 nanometers to 50 nanometers.

For example, the first insulating layer 201, the second insulating layer 202, and the third insulating layer 203 are, for example, inorganic insulating layers, for example, oxides of silicon such as silicon oxide, silicon nitride, and silicon oxynitride, nitrides of silicon, or nitrogen oxides of silicon; insulating materials comprising metal oxynitrides such as aluminum oxide, titanium nitride, etc. For example, these insulating layers may also be organic materials, for example, polyimide (PI), acrylate, epoxy resin, and polymethyl methacrylate (PMMA), etc., which will not be limited in the embodiment of the present disclosure.

For example, the first insulating layer 201 is made of silicon oxide, and has a thickness of 300 nanometers to 500 nanometers. For example, the second insulating layer 202 is made of silicon oxide, and has a thickness of 100 nanometers to 160 nanometers. For example, the third insulating layer is made of silicon oxide, and has a thickness of 400 nanometers to 600 nanometers.

For example, referring to FIG. 3B, a fourth insulating layer 204, a color filter layer, and a fifth insulating layer 205 may also be sequentially formed on the third conductive layer 503; a first electrode 123 of a light-emitting element is formed on the fifth insulating layer 205 123; then a pixel defining layer 206 is formed on the first electrode 123; and a light-emitting layer 124 and a second electrode 122 are sequentially formed, so as to form the display substrate 10 as shown in FIG. 3A.

For example, the forming a color filter layer may comprise firstly forming a red color filter layer and performing a patterning process on the red color filter layer to form a color filter portion corresponding to a red sub-pixel, then forming a green color filter layer and performing a patterning process on the green color filter layer to form a color filter portion corresponding to a green sub-pixel, and then forming a blue color filter layer and performing a patterning process on the blue color filter layer to form a color filter portion corresponding to a blue sub-pixel.

For example, thicknesses of the red color filter layer, the green color filter layer and the blue color filter layer are respectively 2,000 nanometers to 3,000 nanometers, that is, a thickness of each color filter portion is 2,000 nanometers to 3,000 nanometers.

For example, a light shielding portion may be formed by overlapping color filter portions between adjacent sub-pixels to avoid color crosstalk.

For example, the conductive structure or the signal line in the display substrate may be etched to form a concave structure; or a surface of the conductive structure or the signal line may be subjected to plasma processing to form the first surface microstructure and the second surface microstructure as described above.

At least one embodiment of the present disclosure further provides a display panel, comprising any one of the above display substrates 10. It should be noted that, the above-described display substrate 10 provided by at least one embodiment of the present disclosure may or may not comprise a light-emitting element 125, that is, the light-emitting element 125 may be formed in a panel factory after the display substrate 10 is completed. In a case where the display substrate 10 per se does not comprise a light-emitting element 125, the display panel provided by the embodiment of the present disclosure further comprises the light-emitting element 125 in addition to the display substrate 10.

For example, the display panel is an OLED display panel, and correspondingly, the display substrate 10 comprised therein is an OLED display substrate. As shown in FIG. 5A, for example, the display panel 20 further comprises an encapsulation layer 801 and a cover plate 802 provided on the display substrate 10; the encapsulation layer 801 is configured to seal the light-emitting element on the display substrate 10 to prevent external moisture and oxygen from penetrating into the light-emitting element and a driving circuit to cause damage to the device. For example, the encapsulation layer 801 comprises an organic thin film or a structure in which an organic thin film and an inorganic thin film are alternately stacked. For example, a water absorption layer (not shown) may be further provided between the encapsulation layer 801 and the display substrate 10, and be configured to absorb residual water vapor or sol in a preliminary fabrication process of the light-emitting element. The cover plate 802 is, for example, a glass cover plate. For example, the cover plate 802 and the encapsulation layer 801 may be an integral structure.

Figures 5B, 6:
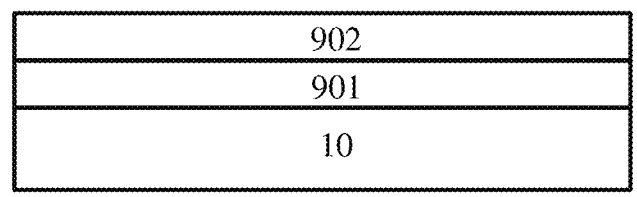
FIG. 5B is a schematic diagram II of a display panel provided by at least one embodiment of the present disclosure.
FIG. 6 is a schematic diagram of a display apparatus provided by at least one embodiment of the present disclosure.

In other examples, as shown in FIG. 5B, the display panel comprises an adhesive layer 901 and a metal encapsulation layer 902 provided on the display substrate 10. In addition to an encapsulation function, the metal encapsulation layer 902 may also support and fix the display substrate 10, for example, in large-size applications, support the display substrate 10 to reduce stress impact on the display substrate 10. For example, the display substrate 10 has a bottom emission structure, and the metal encapsulation layer 902 will not block display light.

At least one embodiment of the present disclosure further provides a display apparatus 30; as shown in FIG. 6, the display apparatus 30 comprises any one of the display substrate 10 or the display panel 20 as described above; the display apparatus according to this embodiment may be: a monitor, an OLED panel, an OLED television, electronic paper, a mobile phone, a tablet personal computer, a laptop, a digital photo frame, a navigator, and any other product or component having a display function.

For example, the above-described patterning process may adopt a conventional photoetching process, for example, comprising steps of photoresist coating, exposure, development, drying, and etching.

What have been described above merely are exemplary embodiments of the present disclosure, and not intended to define the scope of the present disclosure, and the scope of the present disclosure is determined by the appended claims.

What is claimed is:

1. A display substrate, comprising a base substrate and a first conductive structure on the base substrate,
    wherein the first conductive structure comprises a first surface and a second surface away from the base substrate, and the first surface and the second surface are made of a same material;
    the first surface has a first included angle with a plate surface of the base substrate, the second surface has a second included angle with the plate surface of the base substrate, and the first included angle is different from the second included angle;
    the first surface is provided with a first surface microstructure, and the second surface is provided with a second surface microstructure;
    the first conductive structure further comprises a third surface and a fourth surface close to the base substrate, the third surface is opposite to the first surface, and the fourth surface is opposite to the second surface;
    the first surface microstructure has a first cross section perpendicular to the base substrate, the first cross section has a first orthogonal projection on the third surface, and a length of the first orthogonal projection is less than a length of the first surface microstructure in the first cross section; and
    the second surface microstructure has a second cross section perpendicular to the base substrate, the second cross section has a second orthogonal projection on the fourth surface, and a length of the second orthogonal projection is less than a length of the second surface microstructure in the second cross section.

2. The display substrate according to claim 1, wherein in a direction perpendicular to the base substrate, the first surface microstructure at least partially overlaps with the third surface, and the second surface microstructure at least partially overlaps with the fourth surface;
    at least one of the third surface and the fourth surface is a flat surface.

3. The display substrate according to claim 1, wherein an area of the orthogonal projection of the first surface microstructure on the third surface is less than a surface area of the first surface microstructure; and
    an area of the orthogonal projection of the second surface microstructure on the fourth surface is less than a surface area of the second surface microstructure.

4. The display substrate according to claim 1, wherein a minimum thickness of the first conductive structure at the first surface microstructure is less than an average thickness of the first conductive structure and greater than ⅗ of the average thickness of the first conductive structure.

5. The display substrate according to claim 1, wherein the first surface microstructure has a first end point, a first intermediate point and a second end point in the first cross section; and the second surface microstructure has a third end point, a second intermediate point, and a fourth end point in the second cross section;
    a distance between the first intermediate point and the third surface is equal to neither a distance between the first end point and the third surface nor a distance between the second end point and the third surface;
    a distance between the second intermediate point and the fourth surface is equal to neither a distance between the third end point and the fourth surface, nor a distance between the fourth end point and the fourth surface.

6. The display substrate according to claim 1, wherein the first included angle is greater than 0 degrees; and the second included angle is equal to 0 degrees.

7. The display substrate according to claim 6, further comprising a first insulating layer on a side of the first conductive structure close to the base substrate,
    wherein the first insulating layer comprises a first portion in direct contact with the third surface of the first conductive structure and a second portion in direct contact with the fourth surface of the first conductive structure; and
    a minimum thickness of the first portion is less than a minimum thickness of the second portion.

8. The display substrate according to claim 7, further comprising a second conductive structure on a side of the first insulating layer close to the base substrate, wherein in a direction perpendicular to the base substrate, the first surface microstructure and the second conductive structure are not overlapped with each other; and
    the first conductive structure is electrically connected with the second conductive structure through a first via hole running through the first insulating layer;

in a direction perpendicular to the base substrate, the first surface microstructure is at least partially overlapped with the first via hole.

9. The display substrate according to claim 8, wherein the first insulating layer comprises a first sub-layer and a second sub-layer that are stacked, and the second sub-layer is farther away from the base substrate than the first sub-layer; and the first sub-layer comprises a first side surface exposed by the first via hole, the second sub-layer comprises a second side surface exposed by the first via hole, and at least one of the first side surface and the second side surface is in direct contact with the third surface of the first conductive structure.

10. The display substrate according to claim 9, wherein an included angle between the first side surface and the base substrate is greater than an included angle between the second side surface and the base substrate.

11. The display substrate according to claim 1, wherein the first surface microstructure has a first end point and a second end point in the first cross section; and the second surface microstructure has a third end point and a fourth end point in the second cross section;

a distance from a midpoint of a line segment between the first end point and the second end point to the plate surface of the base substrate is different from a distance from a midpoint of a line segment between the third end point and the fourth end point to the plate surface of the base substrate; and a distance between the first end point and the second end point is greater than a distance between the third end point and the fourth end point.

12. The display substrate according to claim 1 wherein the first surface microstructure has a first end point and a second end point in the first cross section; and distances from a point of the first cross section that is closest to the third surface to the first end point and the second end point are unequal.

13. The display substrate according to claim 1, wherein the first surface microstructure comprises a first concave structure, and the second surface microstructure comprises a second concave structure.

14. The display substrate according to claim 1, further comprising a plurality of sub-pixels on the base substrate, wherein the plurality of sub-pixels are arranged as a plurality of pixel columns and a plurality of pixel rows along a first direction and a second direction, the first direction intersecting with the second direction;

each of the plurality of sub-pixels comprises a first transistor, a second transistor, a third transistor, and a storage capacitor on the base substrate;

a first electrode of the second transistor is electrically connected with a first capacitor electrode of the storage capacitor and a gate electrode of the first transistor, a second electrode of the second transistor is configured to receive a data signal, a gate electrode of the second transistor is configured to receive a first control signal, and the second transistor is configured to write the data signal into the gate electrode of the first transistor and the storage capacitor in response to the first control signal;

a first electrode of the first transistor is electrically connected with a second capacitor electrode of the storage capacitor, and is configured to be electrically connected with a first electrode of the light-emitting element, a second electrode of the first transistor is configured to receive a first power supply voltage, and the first transistor is configured to control a current used to drive the light-emitting element under control of a voltage of the gate electrode of the first transistor; and a first electrode of the third transistor is electrically connected with the first electrode of the first transistor and the second capacitor electrode of the storage capacitor, and a second electrode of the third transistor is configured to be connected with a detection circuit.

15. The display substrate according to claim 14, wherein components of a center distance between an orthogonal projection of the first surface microstructure on the base substrate and an orthogonal projection of the second surface microstructure on the base substrate in the first direction and in the second direction are respectively less than average sizes of each of the plurality of sub-pixels in the first direction and the second direction.

16. The display substrate according to claim 14, wherein the display substrate further comprises an extension portion protruding from the gate electrode of the first transistor, the extension portion is extended from the gate electrode of the first transistor along the second direction, and the extension portion is at least partially overlapped with the first electrode of the second transistor and is electrically connected with the first electrode of the second transistor in a direction perpendicular to the base substrate.

17. The display substrate according to claim 16, wherein an active layer of the second transistor comprises a first electrode contact region, a second electrode contact region, and a channel region between the first electrode contact region and the second electrode contact region; and the first electrode of the second transistor is respectively electrically connected with the first electrode contact region, the extension portion, and the first capacitor electrode through a second via hole.

18. The display substrate according to claim 17, wherein the second via hole is extended along the first direction and exposes at least a portion of a surface of the extension portion and two side surfaces, which are opposite in the first direction, of the extension portion.

19. The display substrate according to claim 18, wherein the extension portion spaces the second via hole into a first groove and a second groove; the first electrode of the second transistor fills the first groove and the second groove and covers the two side surfaces of the extension portion;

the first electrode of the second transistor comprises a first portion, a second portion and a third portion; and the second portion covers the surface of the extension portion, the first portion covers the first groove, and the third portion covers the second groove; the first portion and the third portion also respectively cover the two side surfaces of the extension portion.

20. The display substrate according to claim 19, wherein the first conductive structure is the first electrode of the second transistor; and the first surface microstructure and the second surface microstructure are both in the third portion of the first electrode of the second transistor.

21. The display substrate according to claim 20, wherein a size of the first surface microstructure in the first direction is less than one-tenth of a maximum size of the third portion along the first direction.

22. The display substrate according to claim 20, wherein a size of the first surface microstructure in the first direction is less than one-tenth of a maximum size of an orthogonal projection of the second via hole on the base substrate in the first direction.

23. The display substrate according to claim 14, wherein each of the plurality of sub-pixels further comprises the light-emitting element, the light-emitting element comprises a first electrode, a light-emitting layer and a second electrode stacked in sequence, and the first electrode is closer to the base substrate than the second electrode; and

- the first electrode of the light-emitting element is electrically connected with the first electrode of the first transistor of the sub-pixel to which the light-emitting element belongs through a third via hole
- the first electrode of the light-emitting element comprises a first electrode portion, a second electrode portion, and a third electrode portion that are sequentially connected in the first direction; the first electrode portion is configured to be electrically connected with the first electrode of a corresponding first transistor and is overlapped with the first electrode of the corresponding first transistor in a direction perpendicular to the base substrate;
- the third electrode portion of the light-emitting element at least partially overlaps with an opening region of the light-emitting element in the direction perpendicular to the base substrate.

24. The display substrate according to claim 23, wherein a sum of a maximum size of the first electrode portion along the first direction and a maximum size of the first electrode portion along the second direction is less than a sum of a maximum size of the third electrode portion along the first direction and a maximum size of the third electrode portion along the second direction; and

- a sum of a maximum size of the second electrode portion along the first direction and a maximum size of the second electrode portion along the second direction is less than the sum of the maximum size of the third electrode portion along the first direction and the maximum size the third electrode portion along the second direction.

25. The display substrate according to claim 23, wherein for at least one of the plurality of sub-pixels, the display substrate comprises a plurality of first surface microstructures and a plurality of second surface microstructures;

- some of the plurality of first surface microstructures and the plurality of second surface microstructures are overlapped with the first electrode portion in the direction perpendicular to the base substrate, and the others of the plurality of first surface microstructures and the plurality of second surface microstructures are overlapped with the third electrode portion in the direction perpendicular to the base substrate; and
- distribution density of the first surface microstructures and the second surface microstructures overlapping with the first electrode portion is greater than distribution density of the first surface microstructures and the second surface microstructures overlapping with the third electrode portion of the light emitting-element of the at least one sub-pixel.

26. The display substrate according to claim 23, wherein an average size of the second electrode portion of the first electrode of the light-emitting element in the second direction is less than an average size of the first electrode portion in the second direction, and is also less than an average size of the third electrode portion in the second direction.

27. The display substrate according to claim 23 wherein the plurality of pixel rows comprise a first pixel row, and the first pixel row is divided into a plurality of pixel units;

each of the plurality of pixel units comprises a first sub-pixel, a second sub-pixel, and a third sub-pixel that are sequentially arranged along the second direction;

the display substrate further comprises a first scan line extended along the second direction; the first scan line is electrically connected with gate electrodes of second transistors in the first sub-pixel, the second sub-pixel, and the third sub-pixel to supply the first control signal.

28. The display substrate according to claim 27, further comprising a color filter layer, wherein the color filter layer is on a side of the first electrode of the light-emitting element close to the base substrate;

- the color filter layer comprises a plurality of color filter portions respectively corresponding to the first sub-pixel, the second sub-pixel, and the third sub-pixel; and
- light emitted by the first sub-pixel, the second sub-pixel, and the third sub-pixel is respectively emergent through the corresponding color filter portions to form display light of three primary colors respectively.

29. The display substrate according to claim 28, wherein in the direction perpendicular to the base substrate, each of the color filter portions is overlapped with the third electrode portion of the first electrode of a light-emitting element of a corresponding sub-pixel, and is not overlapped with the first electrode portion of the first electrode of the light-emitting element of the corresponding sub-pixel.

30. The display substrate according to claim 29, wherein the first scan line is on a side of the color filter layer close to the base substrate;

- in the direction perpendicular to the base substrate, the second electrode portion of the first electrode of the light-emitting element of the first sub-pixel overlapping with the first scan line also overlaps with the color filter portion corresponding to the first sub-pixel.

31. The display substrate according to claim 28, wherein the first scan line comprises first portions and second portions that are alternately connected; and each of the second portion is in a ring structure the display substrate further comprises a plurality of first signal lines extended along the first direction; and

- in the direction perpendicular to the base substrate, the plurality of first signal lines overlap with the second portions of the first scan line to define a plurality of first hollow regions along the second direction.

32. The display substrate according to claim 31, wherein in the direction perpendicular to the base substrate, the color filter portion corresponding to the first sub-pixel is overlapped with at least one of the plurality of first hollow regions; and the color filter portion corresponding to the second sub-pixel is overlapped with none of the plurality of first hollow regions.

33. The display substrate according to claim 31, wherein in the direction perpendicular to the base substrate, the color filter portion corresponding to the first sub-pixel is overlapped with one of the plurality of first hollow regions with a first overlap area; the color filter portion corresponding to the second sub-pixel is overlapped with another of the plurality of first hollow regions with a second overlap area; and

- the first overlap area is different from the second overlap area.

34. The display substrate according to claim 33, wherein the display substrate comprises a plurality of first surface microstructures and a plurality of second surface microstructures; and some of the plurality of first surface microstructures and the plurality of second surface microstructures are overlapped with the first portions of the first scan line in the direction perpendicular to the base substrate; and the others of the plurality of first surface microstructures and the plurality of second surface microstructures are overlapped with the second portions of the first scan line in the direction perpendicular to the base substrate;

in the direction perpendicular to the base substrate, distribution density of the first surface microstructures and the second surface microstructures overlapping with the second portions of the first scan line is greater than distribution density of the first surface microstructures and the second surface microstructures overlapping with the first portions of the first scan line.

35. The display substrate according to claim 34, wherein the first overlap area is greater than an area of an orthogonal projection of each of the plurality of first surface microstructures or second surface microstructures on the base substrate;

the second overlap area is greater than an area of an orthogonal projection of each of the plurality of first surface microstructures or second surface microstructures on the base substrate.

36. The display substrate according to claim 31, wherein each of the plurality of pixel unit further comprises a fourth sub-pixel, and the fourth sub-pixel is configured to emit white light;

none of first hollow regions close to the fourth sub-pixel among the plurality of first hollow regions is overlapped with the color filter layer in the direction perpendicular to the base substrate.

37. The display substrate according to claim 31, wherein the plurality of signal lines comprise a plurality of data lines, and the plurality of data lines are connected in one-to-one correspondence with the plurality of pixel columns;

for the first pixel row, the plurality of data lines are divided into a plurality of data line groups in one-to-one correspondence with the plurality of pixel units; each of the plurality of data line groups comprises a first data line, a second data line and a third data line respectively connected with the first sub-pixel, the second sub-pixel, and the third sub-pixel;

for each of the plurality of pixel units, the first data line, the second data line and the third data line in corresponding connection with the each pixel unit are all located between the first sub-pixel and the third sub-pixel.

38. The display substrate according to claim 37, further comprising a plurality of power lines extended along the first direction, wherein the plurality of power lines are configured to supply a first power supply voltage to the plurality of sub-pixels; and between each of the plurality of power lines and any one of the plurality of data lines is provided with at least one pixel column.

39. The display substrate according to claim 38, wherein the display substrate comprises a plurality of first surface microstructures and a plurality of second surface microstructures; some of the plurality of first surface microstructures and the plurality of second surface microstructures are distributed on the plurality of data lines, the others of the plurality of first surface microstructures and the plurality of second surface microstructures are distributed on the plurality of power lines;

distribution density of the plurality of first surface microstructures and the plurality of second surface microstructures on the plurality of data lines is greater than distribution density of the plurality of first surface microstructures and the plurality of second surface microstructures on the plurality of power lines.

40. The display substrate according to claim 37, wherein the second sub-pixel is directly adjacent to the third sub-pixel, and the third sub-pixel has a first side and a second side opposite to each other in the second direction; and the second data line and the third data line are located on the first side of the third sub-pixel and located between the second sub-pixel and the third sub-pixel;

the second electrode portion of the first electrode of the light-emitting element of the third sub-pixel is concave relative to the first electrode portion and the third electrode portion of the first electrode of the light-emitting element of the third sub-pixel in a direction away from the second side of the third sub-pixel.

41. The display substrate according to claim 37, wherein in the direction perpendicular to the substrate, the second data line and the third data line are respectively at least partially overlapped with the color filter layer;

each of the plurality of pixel units further comprises a fourth sub-pixel, and the fourth sub-pixel is configured to emit white light;

each of the data line groups further comprises a fourth data line connected with the fourth sub-pixel; and in the direction perpendicular to the base substrate, the fourth data line does not overlap with the color filter layer.

42. A display apparatus, comprising the display substrate according to claim 1.

* * * * *